US012586529B2

(12) United States Patent
Yang

(10) Patent No.: US 12,586,529 B2
(45) Date of Patent: Mar. 24, 2026

(54) DISPLAY APPARATUS

(71) Applicant: LG Display Co., Ltd., Seoul (KR)

(72) Inventor: Jonghyun Yang, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/960,474

(22) Filed: Nov. 26, 2024

(65) Prior Publication Data

US 2025/0279051 A1 Sep. 4, 2025

(30) Foreign Application Priority Data

Feb. 29, 2024 (KR) ........................ 10-2024-0029896

(51) Int. Cl.
| | |
|---|---|
| *G09G 3/3233* | (2016.01) |
| *G09G 3/3266* | (2016.01) |
| *H10K 59/121* | (2023.01) |
| *H10K 59/131* | (2023.01) |
| *H10K 59/35* | (2023.01) |

(52) U.S. Cl.
CPC ......... *G09G 3/3233* (2013.01); *G09G 3/3266* (2013.01); *H10K 59/1216* (2023.02); *H10K 59/131* (2023.02); *H10K 59/35* (2023.02); *G09G 2300/0452* (2013.01); *G09G 2300/0819* (2013.01); *G09G 2300/0852* (2013.01); *G09G 2300/0861* (2013.01)

(58) Field of Classification Search
CPC ............... G09G 3/3233; G09G 3/3266; G09G 2300/0452; G09G 2300/0819; G09G 2300/0852; G09G 2300/0861; H10K 59/131; H10K 59/35; H10K 59/1216
See application file for complete search history.

(56) References Cited

U.S. PATENT DOCUMENTS

| | | | | |
|---|---|---|---|---|
| 2023/0206858 A1* | 6/2023 | Kim | ..................... | G09G 3/3275 345/204 |
| 2023/0316969 A1* | 10/2023 | Ding | ..................... | G09G 3/006 324/537 |
| 2024/0331643 A1* | 10/2024 | Yu | ............................ | G09G 3/20 |
| 2024/0349535 A1* | 10/2024 | Liu | ........................ | H10K 59/00 |

FOREIGN PATENT DOCUMENTS

| | | | | | |
|---|---|---|---|---|---|
| CN | 106782329 A | * | 5/2017 | .......... | G09G 3/3258 |
| KR | 10-2476467 B1 | | 12/2022 | | |
| KR | 10-2023-0096529 A | | 6/2023 | | |

* cited by examiner

*Primary Examiner* — Stacy Khoo
(74) *Attorney, Agent, or Firm* — Birch, Stewart, Kolasch & Birch, LLP

(57) ABSTRACT

A display apparatus according to an example of the present disclosure includes a display panel having an active area in which a plurality of sub pixels of different colors are disposed and a non-active area adjacent to the active area, a light emitting diode disposed in each of the plurality of sub pixels and having an anode and a cathode, and a common reset voltage line connected to the anode to transmit different reset voltages to the anode in each of the plurality of sub pixels.

11 Claims, 11 Drawing Sheets

DISPLAY APPARATUS

CROSS-REFERENCE TO RELATED APPLICATIONS

This application claims priority to Korean Patent Application No. 10-2024-0029896 filed on Feb. 29, 2024, in the Korean Intellectual Property Office, the entire contents of which is hereby expressly incorporated by reference into the present application.

BACKGROUND

Field

The present disclosure relates to a display apparatus, and more particularly, to a display apparatus which resets an anode with an optimal voltage for every sub pixel.

Discussion of the Related Art

As technology in modern society develops, display apparatuses are used in various ways to provide information to users. The display apparatuses are included not only in electronic signs which simply transmit visual information in one direction, but also in various electronic devices which require higher level of technology to check the user's input and provide information in response to the checked input.

A representative display apparatus can include a liquid crystal display device (LCD), a field emission display device (FED), an electro-wetting display device (EWD), an organic light emitting display device (OLED), and the like.

Among these devices, the organic light emitting display apparatus is a self-emitting display apparatus since a separate light source is not needed, which is different from the liquid crystal display apparatus. Therefore, the organic light emitting display apparatus can be manufactured to have a light weight and a small thickness.

Further, since the organic light emitting display apparatus is advantageous not only in terms of power consumption due to the low voltage driving, but also in terms of color implementation, a response speed, a viewing angle, and a contrast ratio (CR), it is expected to be utilized in various fields.

SUMMARY OF THE DISCLOSURE

An object to be achieved by aspects of the present disclosure is to provide a display apparatus which resets an anode with an optimal voltage for every sub pixel.

An object to be achieved by aspects of the present disclosure is to provide a display apparatus which supplies an optimal reset voltage for every sub pixel without adding a separate voltage line in an active area.

An object to be achieved by aspects of the present disclosure is to provide a display apparatus which compensates for a reset voltage.

Objects of the present disclosure are not limited to the above-mentioned objects, and other objects, which are not mentioned above, can be clearly understood by those skilled in the art from the following descriptions.

A display apparatus according to an example embodiment of the present disclosure includes a display panel including an active area in which a plurality of sub pixels with different colors is disposed and a non-active area which encloses the active area, a light emitting diode which is disposed in each of the plurality of sub pixels and includes an anode and a cathode and a common reset voltage line which is connected to the anode to transmit different reset voltages to the anode in each of the plurality of sub pixels.

Other detailed matters of the example embodiments of the present disclosure are included in the detailed description and the drawings.

According to aspects of the present disclosure, the anode is reset with an optimal voltage for every sub pixel to improve electro-optical characteristics.

According to aspects of the present disclosure, one line which supplies a reset voltage is connected to each sub pixel to supply an optimal reset voltage for every sub pixel without adding a separate voltage line in an active area.

According to aspects of the present disclosure, an auxiliary capacitor is disposed between an anode and a low potential voltage line to compensate for a reset voltage.

The effects according to aspects of the present disclosure are not limited to the contents exemplified above, and more various effects are included in the present disclosure.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
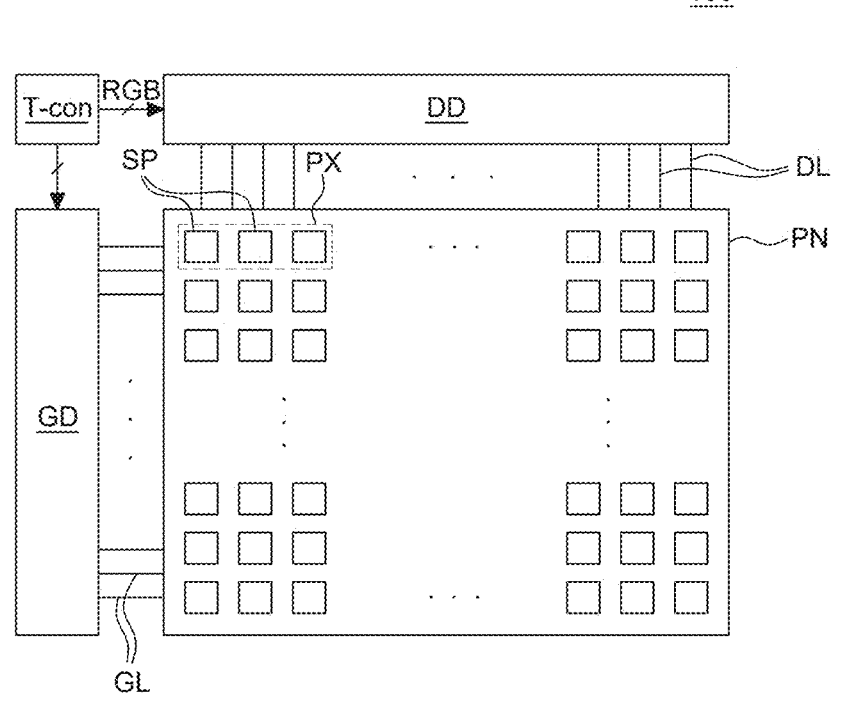
FIG. 1 is a functional block diagram of a display apparatus according to an example embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the disclosure. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise. Further, the term "can" fully encompasses all the meanings and coverages of the term "may."

In describing components of the example embodiment of the present disclosure, terminologies such as first, second, A, B, (a), (b), and the like can be used. These terminologies are used to distinguish a component from the other component, but a nature, an order, or the number of the components is not limited by the terminology. When a component is "linked", "coupled", or "connected" to another component, the component can be directly linked or connected to the other component. However, unless specifically stated otherwise, it should be understood that a third component can be interposed between the components which can be indirectly linked or connected.

When the position relation between two parts is described using the terms such as "on", "above", "below", and "next", one or more parts can be positioned between the two parts unless the terms are used with the term "immediately" or "directly".

Although the terms "first", "second", and the like are used for describing various components, these components are not confined by these terms. These terms are merely used for distinguishing one component from the other components. Therefore, a first component to be mentioned below can be a second component in a technical concept of the present disclosure.

The features of various embodiments of the present disclosure can be partially or entirely adhered to or combined with each other and can be interlocked and operated in technically various ways, and the embodiments can be carried out independently of or in association with each other.

The following embodiments will be described focusing on the organic light emitting display device. However, embodiments of the present disclosure are not limited to organic light emitting display devices and can be applied to various electroluminescent displays. For example, the electroluminescent display apparatus can use an organic light emitting diode (OLED) display apparatus, a quantum dot light emitting diode display apparatus, or an inorganic light emitting diode display apparatus.

Hereinafter, example embodiments of the present disclosure will be described in detail with reference to accompanying drawings. All the components of each display apparatus according to all embodiments of the present disclosure are operatively coupled and configured.

FIG. 1 is a functional block diagram of a display apparatus according to an example embodiment of the present disclosure.

The display apparatus according to the example embodiment of the present disclosure can be applied to an electroluminescent display. The electroluminescent display apparatus can use an organic light emitting diode (OLED) display apparatus, a quantum dot light emitting diode display apparatus, or an inorganic light emitting diode display apparatus.

Referring to FIG. 1, a display apparatus 100 can include a display panel PN, a data driving circuit DD, a gate driving circuit GD, and a timing controller T-con.

The display panel PN can generate images to be provided to the user. For example, the display panel PN can generate and display images to be provided to the user through a plurality of pixels PX in which the pixel circuits are disposed.

The data driving circuit DD, the gate driving circuit GD, and the timing controller T-con can provide signals for operations of the pixels PX through signal lines. For example, the signal lines can include a plurality of data lines DL and a plurality of gate lines GL.

In some cases, the display apparatus 100 can further include a power unit. In this case, a power voltage for an operation of the pixel PX can be supplied through a power line which connects the power unit and the display panel PN. According to the example embodiment, the power unit can supply a power to the data driving circuit DD and the gate driving circuit GD. The data driving circuit DD and the gate driving circuit GD can be driven based on the power supplied from the power unit.

The data driving circuit DD applies a data voltage to each pixel PX through the plurality of data lines DL, the gate driving circuit GD applies a gate signal to each pixel PX through the plurality of gate lines GL, and the power unit can supply a power voltage to each pixel PX through the power voltage supply lines.

The timing controller T-con can control the data driving circuit DD and the gate driving circuit GD. For example, the timing controller T-con rearranges digital video data input from the outside in accordance with a resolution of the display panel PN to supply the digital video data to the data driving circuit DD.

The data driving circuit DD converts digital video data input from the timing controller T-con into an analog data voltage based on the data control signal to supply the converted analog data voltage to the plurality of data lines DL.

The gate driving circuit GD can generate a scan signal and an emission signal (or an emission control signal) based on the gate control signal. The gate driving circuit GD can include a scan driver and an emission signal driver. The scan driver generates a scan signal in a row sequential manner to drive at least one scan line connected to each pixel row to supply the scan signal to the scan lines. The emission signal driver generates an emission signal in a row sequential manner to drive at least one emission signal line connected to each pixel row to supply the emission signal to the emission signal lines.

According to the example embodiment, the gate driving circuit GD is divided into a plurality of circuits to be disposed on at least two side surfaces of the display panel PN. Further, the gate driving circuit GD is configured as one circuit to be disposed on at least one side surface of the display panel PN.

Figure 2:
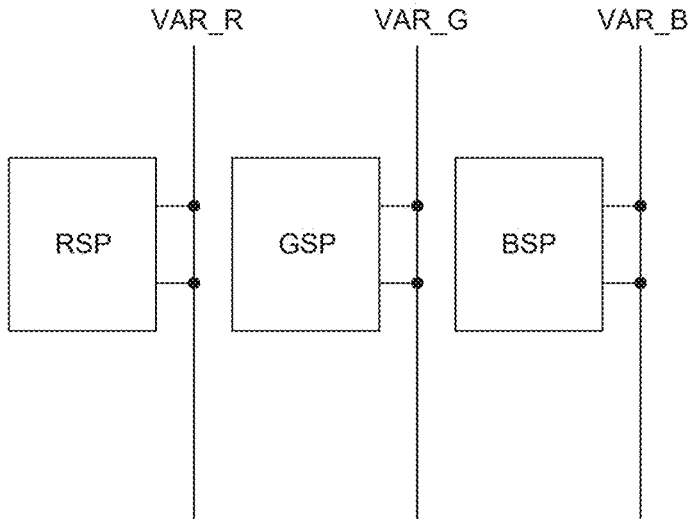
FIG. 2 is a plan view which briefly illustrates a part of an active area according to an example embodiment of the present disclosure.

The display panel PN can include an active area (for example, an active area AA of FIG. 2) and a non-active area (for example, a non-active area NA of FIG. 2). The non-active area NA (or non-display area) can surround the active area AA (or display area) entirely or only in part(s).

The active area can include a plurality of pixels PX. The plurality of pixels PX is disposed in a matrix and each of the plurality of pixels PX can include a plurality of sub pixels SP. Each sub pixel SP is an element which represents one color and can be defined by areas where a plurality of gate lines GL disposed in a first direction intersects a plurality of data lines DL disposed in a second direction which is different from the first direction. Here, the first direction can be a horizontal direction of FIG. 1 and the second direction can be a vertical direction of FIG. 1, but are not limited thereto. The sub pixels SP included in one pixel PX can emit different color light. For example, the pixel PX uses three sub pixels SP to implement blue, red, and green. However, this is not limited thereto and, in some cases, the pixel PX can further include a sub pixel SP for further implementing a specific color (for example, white).

The non-active area is disposed along the circumference of the active area and no image is displayed. In the non-active area, various components for driving a plurality of sub pixels SP disposed in the active area can be disposed. For example, a driving IC, a driving circuit, a signal line, and a flexible film which supply a signal for driving the plurality of sub pixels SP can be disposed. In this case, the driving IC can include a gate driving circuit GD and a data driving circuit DD. The driving IC and the driving circuit can be disposed in a gate in panel (GIP) manner, a chip on film (COF) manner, a tape automated bonding (TAB) manner, a tape carrier package (TCP) manner, or a chip on glass (COG) manner. The non-active area can be referred to as a bezel area.

Figure 3:
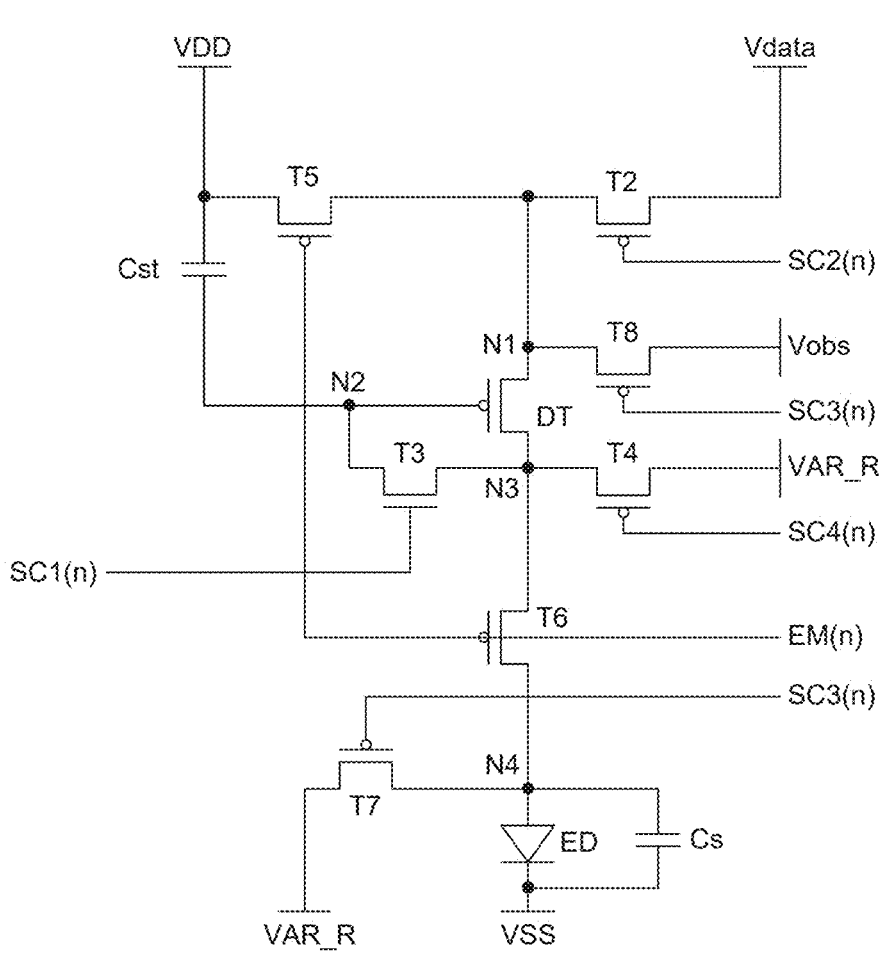
FIG. 3 is an example circuit diagram for a first sub pixel of FIG. 2.

FIG. 2 is a plan view which briefly illustrates a part of an active area according to an example embodiment of the present disclosure. FIG. 3 is an example circuit diagram for a first sub pixel of FIG. 2. In FIG. 3, for the convenience of description, the first sub pixel RSP has been described as an example, but the present disclosure is not limited thereto and the second sub pixel GSP and the third sub pixel BSP can be configured by the same way.

Referring to FIG. 2, the pixel PX can include a plurality of sub pixels RSP, GSP, and BSP which represents different colors, respectively. For example, the pixel PX can include a blue sub pixel BSP which implements blue, a red sub pixel RSP which implements red, and a green sub pixel GSP which implements green. According to the example embodiment, the red sub pixel RSP corresponds to a first sub pixel, the green sub pixel GSP corresponds to a second sub pixel, and the blue sub pixel BSP can correspond to a third sub pixel. The pixel circuit can correspond to each of the sub pixels RSP, GSP, and BSP. A corresponding pixel circuit can be disposed in every sub pixel RSP, GSP, BSP.

A reset voltage VAR_R, VAR_G, VAR_B can be supplied to each of the plurality of sub pixels RSP, GSP, and BSP. Reset voltage lines to which reset voltages VAR_R, VAR_G, are VAR_B are supplied are connected to the plurality of sub pixels RSP, GSP, and BSP to be supplied with the reset voltages VAR_R, VAR_G, are VAR_B. For example, a first reset voltage line to which a first reset voltage VAR_R is supplied is connected to the red sub pixel RSP to be supplied with the first reset voltage VAR_R. A second reset voltage line to which a second reset voltage VAR_G is supplied is connected to the green sub pixel GSP to be supplied with the second reset voltage VAR_G. A third reset voltage line to which a third reset voltage VAR_B is supplied is connected to the blue sub pixel BSP to be supplied with the third reset voltage VAR_B.

Referring to FIG. 3, a circuit of the first sub pixel RSP can include a light emitting diode ED, a driving transistor DT, a second transistor T2, a third transistor T3, a fourth transistor T4, a fifth transistor T5, a sixth transistor T6, a seventh transistor T7, an eighth transistor T8, and a storage capacitor Cst.

The light emitting diode ED can emit light by a driving current supplied from the driving transistor DT. An anode electrode of the light emitting diode ED is connected to a fourth node N4 and a cathode electrode of the light emitting diode ED can be connected to a low potential power line to which a low potential power voltage VSS is supplied.

The driving transistor DT controls a driving current applied to the light emitting diode ED in accordance with a source-gate voltage Vsg. The driving transistor DT can be connected between a first node N1 and a third node N3. For example, a source electrode of the driving transistor DT is connected to the first node N1, a gate electrode is connected to a second node N2, and a drain electrode can be connected to the third node N3. For example, the driving transistor DT can be implemented by a p-type MOSFET (PMOS) or can be implemented by a low temperature polycrystalline silicon (LTPS) thin film transistor. Further, the driving transistor DT can be referred to as a first transistor.

The second transistor T2 can apply a data voltage Vdata supplied from a data line DL to a first node N1 which is the source electrode of the driving transistor DT. The second transistor T2 can be connected between the data line DL and the first node N1. For example, the second transistor T2 can include a source electrode connected to the data line, a drain electrode connected to the first node N1, and a gate electrode connected to a second scan line which transmits a second scan signal SC2(n). For example, the second transistor T2 can be a p-type MOSFET (PMOS) or can be implemented by a low temperature polycrystalline silicon (LTPS) thin film transistor. Accordingly, the second transistor T2 can apply a data voltage Vdata supplied from the data line DL to the first node N1 which is the source electrode of the driving transistor DT, in response to a low level of second scan signal SC2(n) which is a turn-on voltage.

The third transistor T3 can form diode connection of the gate electrode and the drain electrode of the driving transistor DT. The third transistor T3 can be connected between the gate electrode and the drain electrode of the driving transistor DT. For example, the third transistor T3 can include a drain electrode or a source electrode connected to the third node N3, a source electrode or a drain electrode connected to the second node N2, and a gate electrode connected to a first scan line which transmits a first scan signal SC1(n). For example, the third transistor T3 can be an n-type MOSFET (NMOS) and can be implemented by an oxide thin film transistor to minimize a leakage current during a turn-off period. Therefore, the third transistor T3 can diode-connect the gate electrode and the drain electrode of the driving transistor DT in response to a high level of first scan signal SC1(n) which is a turn-on voltage.

The fourth transistor T4 can apply the first reset voltage VAR_R to the third node N3 which is the drain electrode of the driving transistor DT. The fourth transistor T4 can be connected between a first reset voltage line to which a first reset voltage VAR_R is supplied and the third node N3. For example, the fourth transistor T4 can include a source electrode connected to the first reset voltage line, a drain electrode connected to the third node N3, and a gate electrode connected to a fourth scan signal line which transmits a fourth scan signal SC4($n$). For example, the fourth transistor T4 can be a p-type MOSFET (PMOS) or can be implemented by a low temperature polycrystalline silicon (LTPS) thin film transistor. Accordingly, the fourth transistor T4 can apply a first reset voltage VAR_R supplied to the first reset voltage line to the third node N3 which is the drain electrode of the driving transistor DT, in response to a low level of fourth scan signal SC4($n$) which is a turn-on voltage.

The fifth transistor T5 can apply a high potential power voltage VDD to the first node N1 which is the source electrode of the driving transistor DT. The fifth transistor T5 can be connected between a high potential power voltage line which supplies a high potential power voltage VDD and the first node N1. For example, the fifth transistor T5 can include a source electrode connected to a high potential power voltage line which transmits a high potential power voltage VDD, a drain electrode connected to the first node N1, and a gate electrode connected to an emission signal line which transmits an emission signal EM(n). For example, the fifth transistor T5 can be a p-type MOSFET (PMOS) or can be implemented by a low temperature polycrystalline silicon (LTPS) thin film transistor. Accordingly, the fifth transistor T5 can apply the high potential power voltage VDD to the first node N1 which is the source electrode of the driving transistor DT, in response to a low level of emission signal EM(n) which is a turn-on voltage.

The sixth transistor T6 can form a current path between the driving transistor DT and the light emitting diode ED. The sixth transistor T6 can be connected between the third node N3 which is the drain electrode of the driving transistor DT and the fourth node N4 connected to the anode of the light emitting diode ED. For example, the sixth transistor T6 can include a source electrode connected to the third node N3, a drain electrode connected to the fourth node N4, and a gate electrode connected to the emission signal line which transmits an emission signal EM(n). For example, the sixth transistor T6 can be a p-type MOSFET (PMOS) or can be implemented by a low temperature polycrystalline silicon (LTPS) thin film transistor. Accordingly, the sixth transistor T6 can form a current path between the driving transistor DT and the light emitting diode ED in response to a low level of emission signal EM(n) which is a turn-on voltage.

The seventh transistor T7 can apply a reset voltage VAR_M to the fourth node N4 connected to the anode of the light emitting diode ED. The seventh transistor T7 can be connected between a first reset voltage line which supplies the first reset voltage VAR_R and the fourth node N4. For example, the seventh transistor T7 can include a source electrode connected to the first reset voltage line which supplies the first reset voltage VAR_R, a drain electrode connected to the fourth node N4, and a gate electrode connected to a third scan signal line which transmits a third scan signal SC3($n$). For example, the seventh transistor T7 can be a p-type MOSFET (PMOS) or can be implemented by a low temperature polycrystalline silicon (LTPS) thin film transistor. Accordingly, the seventh transistor T7 can apply the first reset voltage VAR_R to the fourth node N4 connected to the anode of the light emitting diode ED, in response to a low level of third scan signal SC3($n$) which is a turn-on voltage.

The storage capacitor Cst can store a voltage applied to the second node N2. The storage capacitor Cst can be connected between the high potential power voltage line which transmits a high potential power voltage VDD and the second node N2. For example, the storage capacitor Cst can include one electrode connected to the second node N2 and the other electrode connected to the high potential power voltage line which transmits a high potential power voltage VDD. For example, one electrode of the storage capacitor Cst is connected to the gate electrode of the driving transistor DT and the other electrode of the storage capacitor Cst can be connected to the high potential power voltage line which transmits the high potential power voltage VDD.

Even though in FIG. 3, the red sub pixel RSP has been described, the green sub pixel GSP and the blue sub pixel BSP are configured with the same configuration as the red sub pixel RSP. However, a fourth transistor T4 of the green sub pixel GSP can be connected between the second reset voltage line to which the second reset voltage VAR_G is supplied and the third node N3. A seventh transistor T7 of the green sub pixel GSP can be connected between the second reset voltage line which supplies the second reset voltage VAR_G and the fourth node N4. Further, A fourth transistor T4 of the blue sub pixel BSP can be connected between the third reset voltage line to which the third reset voltage VAR_B is supplied and the third node N3. A seventh transistor T7 of the blue sub pixel BSP can be connected between the third reset voltage line which supplies the third reset voltage VAR_B and the fourth node N4.

Accordingly, in the display apparatus according to the example embodiment of the present disclosure, reset voltages VAR_R, VAR_G, and VAR_B are supplied to the sub pixels RSP, GSP, and BSP. Therefore, as compared with the example that supplies the same reset voltage to the sub pixels RSP, GSP, and BSP, the electro-optical characteristics of the sub pixels RSP, GSP, and BSP are optimized to improve a display quality.

Further, in the display apparatus according to the example embodiment of the present disclosure, the same reset voltage VAR_R, VAR_G, VAR_B are supplied to the fourth transistor T4 and the seventh transistor T7 of the sub pixels RSP, GSP, and BSP. Therefore, as compared with the related art which separately supplies an initialization voltage to the fourth transistor T4 and supplies a reset voltage to the seventh transistor T7, the number of voltage lines which supply a voltage is reduced so that a degree of freedom of design can be ensured.

Referring to FIG. 3, the first sub pixel RSP can include an auxiliary capacitor Cs.

The auxiliary capacitor Cs can compensate for a voltage applied to the fourth node N4. The auxiliary capacitor Cs can be connected between the fourth node N4 and the low potential power voltage line which supplies a low potential power voltage VSS. For example, the auxiliary capacitor Cs can include one electrode connected to the fourth node N4 and the other electrode connected to a low potential power voltage line which supplies a low potential power voltage VSS. For example, one electrode of the auxiliary capacitor Cs is connected to the fourth node N4 and the other electrode of the auxiliary capacitor Cs is connected to the low potential power voltage line which supplies a low potential power voltage VSS to increase a capacitor between the fourth node N4 and the low potential power voltage line. Therefore, the first reset voltage VAR_R applied to the fourth node N4 can be compensated.

In the example embodiment of the present disclosure, instead of the initialization voltage, a reset voltage VAR_M which is the most similar to the initialization voltage is supplied to the drain electrode of the driving transistor DT of each of the sub pixels RSP, GSP, and BSP and the same reset voltage VAR_M can be supplied to the anode electrode of the light emitting diode ED. For example, a lowest level of reset voltage VAR_R, VAR_G, VAR_B, among first, second, third reset voltages VAR_R, VAR_G, and VAR_B can be supplied to each sub pixel RSP, GSP, BSP. For example, the first reset voltage VAR_R can be supplied to each of the sub pixels RSP, GSP, and BSP, but it is not limited thereto.

A capacity of the capacitor of the light emitting diode ED for every sub pixel RSP, GSP, BSP is different so that there can be a difference between an initialization voltage required for each sub pixel RSP, GSP, BSP and the reset voltages VAR_R, VAR_G, and VAR_B which are applied instead of the initialization voltage.

In this case, reset voltages VAR_R, VAR_G, VAR_B which are lower than a necessary initialization voltage can be applied to each sub pixel RSP, GSP, BSP. In the sub pixel RSP, GSP, and BSP in which there is a difference between the initialization voltage required for each sub pixel RSP, GSP, BSP and a supplied reset voltage VAR_R, VAR_G, VAR_B, the auxiliary capacitor Cs is disposed between the anode electrode and the cathode electrode of the light emitting diode ED. Therefore, the capacitor between the anode electrode and the cathode electrode of the light emitting diode ED can be improved. Accordingly, the reset voltages VAR_R, VAR_G, VAR_B applied to the anode electrode of the light emitting diode ED are increased so that a reset voltage VAR_R, VAR_G, VAR_B similar to the necessary initialization voltage can be applied to the drain electrode of the driving transistor DT.

In the example embodiment of the present disclosure, it has been described that the auxiliary capacitor Cs is disposed only in the first sub pixel RSP, but it is not limited thereto. The auxiliary capacitor Cs may not be disposed when the difference between the initialization voltage required for each sub pixel RSP, GSP, BSP and a supplied reset voltage VAR_R, VAR_G, VAR_B is not so high. The auxiliary capacitor Cs can be disposed in the second sub pixel GSP or the third sub pixel BSP or can also be disposed in all the first sub pixel RSP, the second sub pixel GSP, and the third sub pixel BSP.

Figure 4:
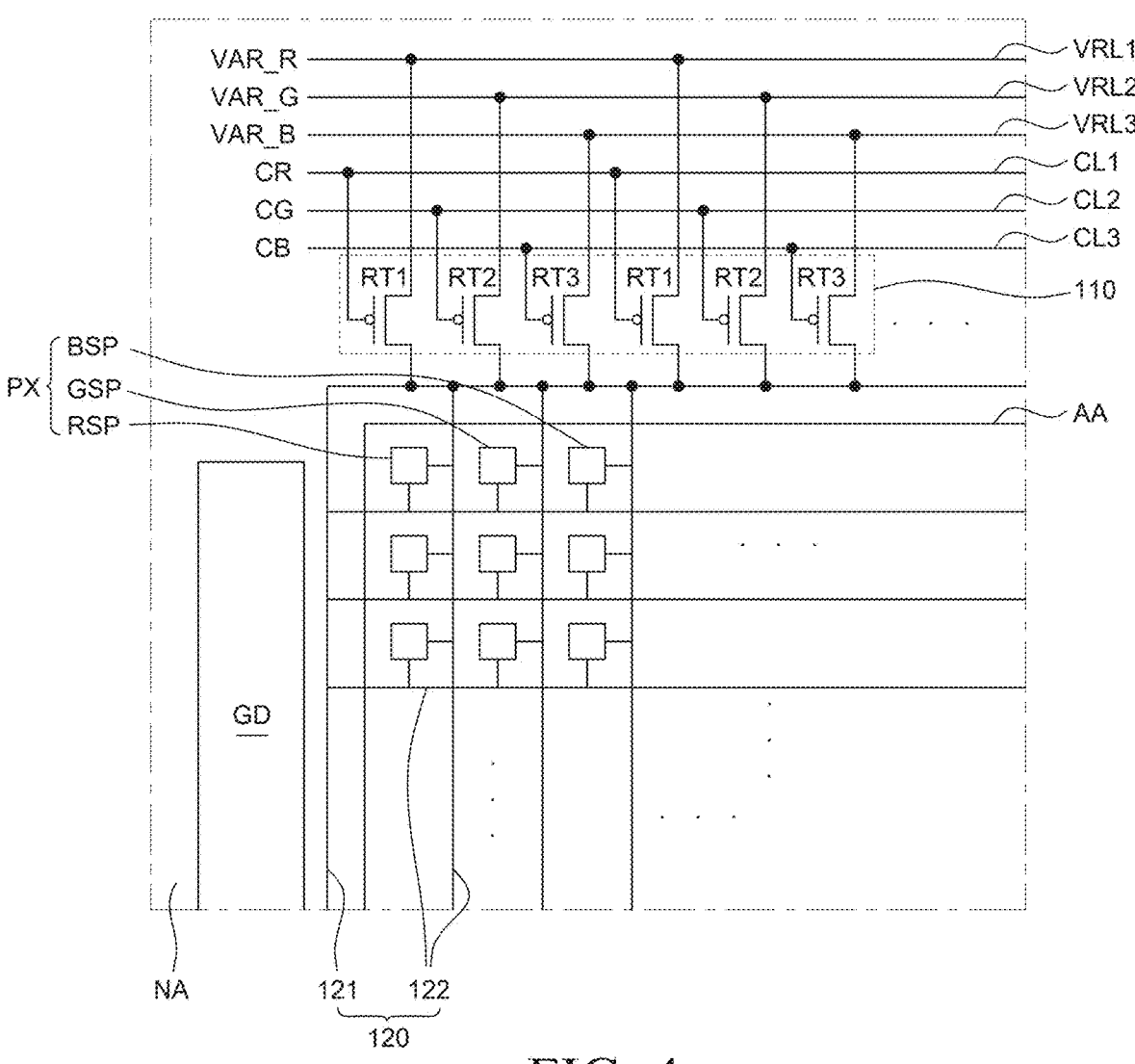
FIG. 4 is a block diagram illustrating a part of a display apparatus according to another example embodiment of the present disclosure.

FIG. 4 is a block diagram illustrating a part of a display apparatus according to another example embodiment of the present disclosure. In FIG. 4, a part of the display panel PN is illustrated for the convenience of description.

Referring to FIG. 4, in the non-active area NA of the display panel PN, the plurality of reset voltage lines VRL1, VRL2, VRL3 can be disposed. The plurality of reset voltage lines VRL1, VRL2, VRL3 can be disposed in at least one side portion, among remaining side portions of the display panel PN excluding a side portion in which the gate driving circuit GD is disposed. For example, the plurality of reset voltage lines VRL1, VRL2, and VRL3 can be disposed to extend in the non-active area NA above the display panel PN in the first direction.

The plurality of reset voltage lines VRL1, VRL2, and VRL3 is connected to the power unit to supply different reset voltages VAR_R, VAR_G, and VAR_B to the plurality of sub pixels RSP, GSP, and BSP.

The plurality of reset voltage lines VRL1, VRL2, and VRL3 can include a first reset voltage line VRL1, a second reset voltage line VRL2, and a third reset voltage line VRL3.

The first reset voltage line VRL1 supplies a first reset voltage VAR_R, the second reset voltage line VRL2 supplies a second reset voltage VAR_G, and the third reset voltage line VRL3 can supply a third reset voltage VAR_B. For example, the first reset voltage VAR_R is a reset voltage which is supplied to the red sub pixel RSP, the second reset voltage VAR_G is a reset voltage which is supplied to the green sub pixel GSP, and the third reset voltage VAR_B can be a reset voltage which is supplied to the blue sub pixel BSP.

The display panel PN can be disposed in the plurality of control signal lines CL1, CL2, and CL3 in the non-active area NA. The plurality of control signal lines CL1, CL2, and CL3 can be disposed in at least one side portion, among remaining side portions of the display panel PN excluding a side portion in which the gate driving circuit GD is disposed. For example, the plurality of control signal lines CL1, CL2, and CL3 can be disposed to extend in the non-active area NA above the display panel PN in the first direction to be parallel to the plurality of reset voltage lines VRL1, VRL2, and VRL3.

The plurality of control signal lines CL1, CL2, and CL3 is connected to the timing controller T-con to supply control signals CR, CG, and CB to a reset voltage supply unit 110.

The plurality of control signal lines CL1, CL2, and CL3 can include a first control signal line CL1, a second control signal line CL2, and a third control signal line CL3.

The first control signal line CL1 supplies the first control signal CR to the reset voltage supply unit 110, the second control signal line CL2 supplies the second control signal CG to the reset voltage supply unit 110, and the third control signal line CL3 can supply the third control signal CB to the reset voltage supply unit 110.

The display panel PN can include a reset voltage supply unit 110 and a common reset voltage line 120.

The reset voltage supply unit 110 is connected to the common reset voltage line 120 to supply different reset voltages VAR_R, VAR_G, and VAR_B, to the plurality of sub pixels RSP, GSP, and BSP with different colors.

The reset voltage supply unit 110 can be disposed in the non-active area NA. The reset voltage supply unit 110 can be disposed in at least one side portion, among remaining side portions of the display panel PN excluding a side portion in which the gate driving circuit GD is disposed. For example, the reset voltage supply unit 110 can be disposed in the non-active area NA above the display panel PN. For example, the reset voltage supply unit 110 can be disposed between the plurality of reset voltage lines VRL1, VRL2, and VRL3 and the common reset voltage line 120.

The reset voltage supply unit 110 can include a plurality of reset transistors RT1, RT2, and RT3. The reset voltage supply unit 110 can include at least one first reset transistor RT1, at least one second reset transistor RT2, and at least one third reset transistor RT3. When the reset voltage supply unit 110 is configured by one first reset transistor RT1, one second reset transistor RT2, and one third reset transistor RT3, a size of the transistor is increased so as to correspond to a voltage level of the reset voltages VAR_R, VAR_G, and VAR_G supplied through the first reset transistor RT1, the second reset transistor RT2, and the third reset transistor RT3. Further, an area of the bezel can be increased. Accordingly, in order to disperse a concentrated voltage, the reset voltage supply unit 110 desirably includes a plurality of first reset transistors RT1, a plurality of second reset transistors RT2, and a plurality of third reset transistors RT3.

The plurality of first reset transistors RT1 can be connected between the first reset voltage line VRL1 to which the first reset voltage VAR_R is supplied and the common reset voltage line 120.

For example, a source electrode of each of the plurality of first reset transistors RT1 is connected to the first reset voltage line VRL1 to which the first reset voltage VAR_R is supplied and a drain electrode can be connected to the common reset voltage line 120. Further, a gate electrode of each first reset transistor RT1 can be connected to the first control signal line CL1 to which a first control signal CR is supplied. For example, the plurality of first reset transistors RT1 can be p-type MOSFETs (PMOS) or can be implemented by low temperature polycrystalline silicon (LTPS) thin film transistors. Therefore, the plurality of first reset transistors RT1 can apply a first reset voltage VAR_R to the common reset voltage line 120 in response to a low level of the first control signal CR which is a turn-on voltage.

The plurality of second reset transistors RT2 can be connected between the second reset voltage line VRL2 to which the second reset voltage VAR_G is supplied and the common reset voltage line 120.

For example, a source electrode of each of the plurality of second reset transistors RT2 is connected to the second reset voltage line VRL2 to which the second reset voltage VAR_G is supplied and a drain electrode can be connected to the common reset voltage line 120. Further, a gate electrode of each second reset transistor RT2 can be connected to a second control signal line CL2 to which a second control signal CG is supplied. For example, the plurality of second reset transistors RT2 can be p-type MOSFETs (PMOS) or can be implemented by low temperature polycrystalline silicon (LTPS) thin film transistors. Therefore, the plurality of second reset transistors RT2 can apply a second reset voltage VAR_G to the common reset voltage line 120 in response to a low level of the second control signal CG which is a turn-on voltage.

The plurality of third reset transistors RT3 can be connected between the third reset voltage line VRL3 to which the third reset voltage VAR_B is supplied and the common reset voltage line 120.

For example, a source electrode of each of the plurality of third reset transistors RT3 is connected to the third reset voltage line VRL3 to which the third reset voltage VAR_B is supplied and the drain electrode can be connected to the common reset voltage line 120. Further, a gate electrode of each third reset transistor RT3 can be connected to a third control signal line CL3 to which a third control signal CB is supplied. For example, the plurality of third reset transistors RT3 can be p-type MOSFETS (PMOS) or can be implemented by low temperature polycrystalline silicon (LTPS) thin film transistors. Therefore, the plurality of third reset transistors RT3 can apply a third reset voltage VAR_B to the common reset voltage line 120 in response to a low level of the third control signal CB which is a turn-on voltage.

The common reset voltage line 120 is connected to the reset voltage supply unit 110 and the plurality of sub pixels RSP, GSP, and BSP to supply different reset voltages to the sub pixels RSP, GSP, and BSP. The common reset voltage line 120 can include at least one first common reset voltage line 121 and a plurality of second common reset voltage lines 122.

The first common reset voltage line 121 can be disposed in the non-active area NA. The first common reset voltage line 121 can be disposed so as to enclose the active area AA. For example, the first common reset voltage line 121 can be disposed in a non-active area in a closed loop shape which encloses the active area AA. For example, the first common reset voltage line 121 can be connected to drain electrodes of the plurality of first reset transistors RT1, the plurality of second reset transistors RT2, and the plurality of third reset transistors RT3.

The plurality of second common reset voltage lines 122 is connected to the first common reset voltage line 121 and extends in the active area AA to be connected to the plurality of sub pixels RSP, GSP, and BSP. The plurality of second common reset voltage lines 122 is connected to the first common reset voltage line 121 and is disposed in the first direction and a second direction which is different from the first direction to have a mesh pattern. However, the present disclosure is not limited thereto and depending on the design, the plurality of second common reset voltage lines 122 can be disposed in one of the first direction and the second direction. The plurality of second common reset voltage lines 122 is commonly connected to each sub pixel RSP, GSP, BSP disposed in an intersecting area. Therefore, the plurality of second common reset voltage lines 122 can supply any one of the first, second, and third reset voltages VAR_R, VAR-G, and VAR_B corresponding to each sub pixel RSP, GSP, BSP, according to an operation of the reset voltage supply unit 110 and the gate signal supplied to each sub pixel RSP, GSP, BSP.

For example, when the low level of first control signal CR is applied to the first control signal line CL1, the plurality of first reset transistors RT1 is turned on to connect the first reset voltage line VRL1 and the first common reset voltage line 121. Therefore, the first reset voltage VAR_R supplied to the first reset voltage line VRL1 can be applied to the first common reset voltage line 121 and the second common reset voltage line 122. At this time, the first reset voltage VAR_R applied to the second common reset voltage line 122 can be supplied to the red sub pixel RSP according to a gate signal supplied to the red sub pixel RSP. For example, when the low level of second control signal CG is applied to the second control signal line CL2, the plurality of second reset transistors RT2 is turned on to connect the second reset voltage line VRL2 and the first common reset voltage line 121. Therefore, the second reset voltage VAR_G supplied to the second reset voltage line VRL2 can be applied to the first common reset voltage line 121 and the second common reset voltage line 122. At this time, the second reset voltage VAR_G applied to the second common reset voltage line 122 can be supplied to the green sub pixel GSP according to a gate signal supplied to the green sub pixel GSP. For example, when the low level of third control signal CB is applied to the third control signal line CL3, the plurality of first reset transistors RT1 is turned on to connect the first reset voltage line VRL1 and the first common reset voltage line 121. Therefore, the first reset voltage VAR_R supplied to the first reset voltage line VRL1 can be applied to the first common reset voltage line 121 and the second common reset voltage line 122. At this time, the third reset voltage VAR_B applied to the second common reset voltage line 122 can be supplied to the blue sub pixel BSP according to a gate signal supplied to the blue sub pixel BSP.

Figure 5:
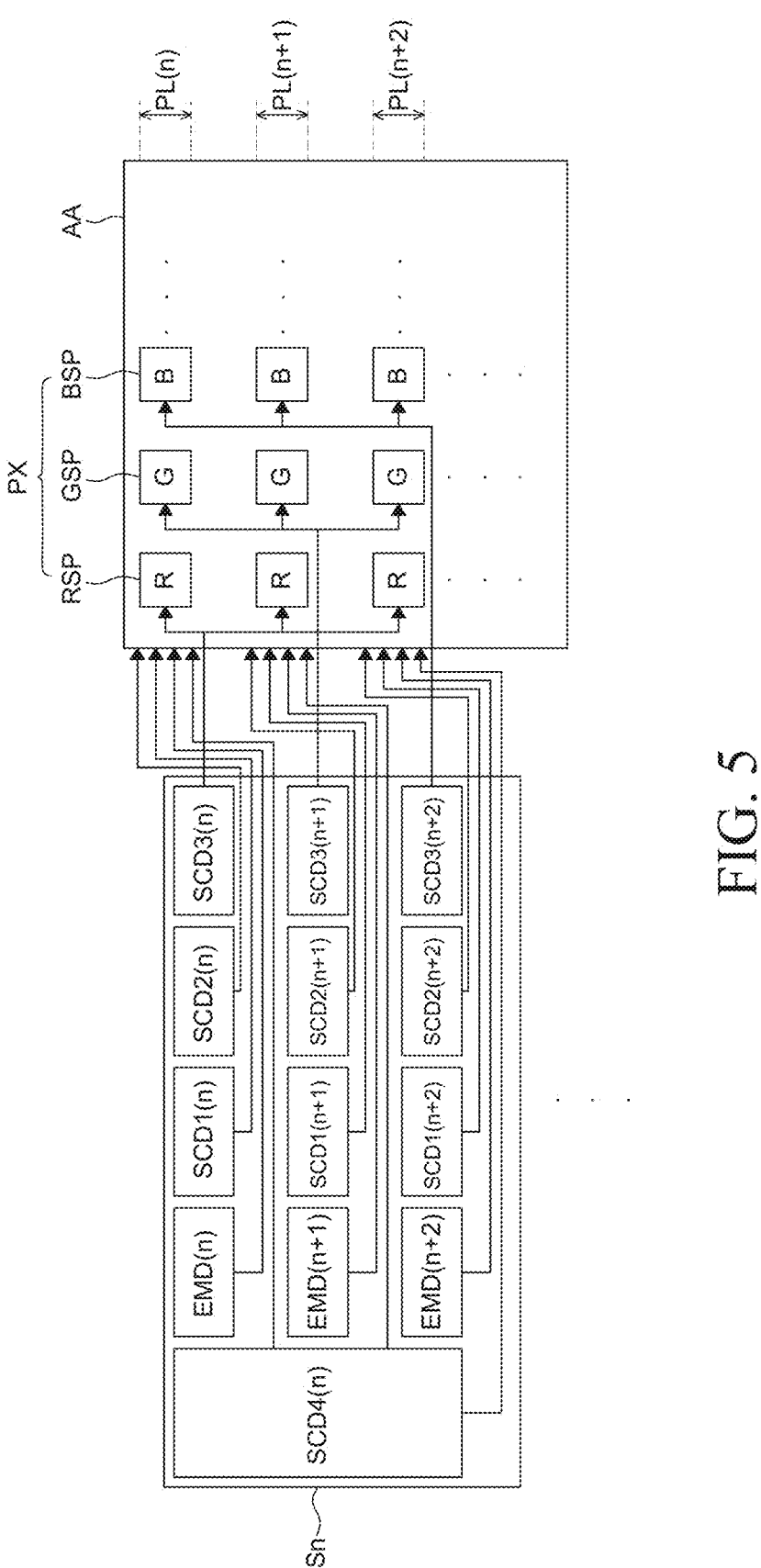
FIG. 5 is a block diagram of a gate driver of a display apparatus according to another example embodiment of the present disclosure.

FIG. 5 is a block diagram of a gate driver of a display apparatus according to another example embodiment of the present disclosure. In FIG. 5, for the convenience of description, an active area AA, first scan drivers SCD1(n), SCD1 (n+1), SCD1(n+2), second scan drivers SCD2(n), SCD2(n+1), SCD2(n+2), third scan drivers SCD3(n), SCD3(n+1), SCD3(n+2), a fourth scan driver SCD4(n), and emission drivers EMD(n), EMD(n+1), EMD(n+2) are illustrated.

Referring to FIG. 5, the display panel PN includes a plurality of pixels PX and each pixel PX can be connected to a gate line disposed along a row line. In this case, the plurality of pixels PX located on the same row line is referred to as a pixel line and the plurality of pixels PX in the same pixel line shares the same gate line and is supplied with a gate signal through a gate line. Accordingly, the plurality of pixels PX connected to an n-th gate line can be referred to as n-th pixel lines PL(n), where n is a real number such as an integer. When the number of pixel lines disposed in the display panel PN is n, a first pixel line to an n-th pixel line PL(n) are synchronized with the gate driver GD to be sequentially driven. In this case, the gate driver GD can include a plurality of stages Sn which is dependently connected to each other and each stage Sn can include a plurality of scan drivers SCD1(*n*) to SCD4(*n*) and the emission driver EMD(n) corresponding to the pixel line.

Referring to FIG. 5, a stage Sn which supplies the gate signal to an n-th pixel line PL(n) to a n+2-th pixel line PL(*n*+2) can include the first scan drivers SCD1(*n*), SCD1 (*n*+1), SCD1(*n*+2), the second scan drivers SCD2(*n*), SCD2 (*n*+1), SCD2(*n*+2), the third scan drivers SCD3(*n*), SCD3 (*n*+1), SCD3(*n*+2), the fourth scan driver SCD4(*n*), and the emission drivers EMD(n), EMD(*n*+1), EMD(*n*+2). The gate line can include a first scan line, a second scan line, a third scan line, a fourth scan line, and an emission signal line. The first scan line is connected to the first scan drivers SCD1(*n*), SCD1(*n*+1), SCD1(*n*+2) to supply the first scan signal and the second scan line is connected to the second scan n drivers SCD2(*n*), SCD2(*n*+1), SCD2(*n*+2) to supply the second scan signal. The third scan line is connected to the third scan drivers SCD3(*n*), SCD3(*n*+1), SCD3(*n*+2) to supply the third scan signal and the fourth scan line is connected to the fourth scan driver SDC4(*n*) to supply the fourth scan signal. The emission signal line is connected to the emission drivers EMD(n), EMD(*n*+1), EMD(*n*+2) to supply an emission signal.

The first scan drivers SCD1(*n*), SCD1(*n*+1), SCD1(*n*+2) can output a first scan signal to the first scan signal line connected to the first scan drivers SCD1(*n*), SCD1(*n*+1), SCD1(*n*+2) in response to the gate control signal from the timing controller T-con. For example, the first scan signal output from the n-th first scan driver SCD1(*n*) can be supplied to the plurality of sub pixels RSP, GSP, BSP disposed in the n-th pixel line PL(n). Further, the first scan signal output from the n+1-th first scan driver SCD1(*n*+1) can be supplied to the plurality of sub pixels RSP, GSP, BSP disposed in the n+1-th pixel line PL(*n*+1). Further, the first scan signal output from the n+2-th first scan driver SCD1 (*n*+2) can be supplied to the plurality of sub pixels RSP, GSP, BSP disposed in the n+2-th pixel line PL(*n*+2).

The second scan drivers SCD2(*n*), SCD2(*n*+1), SCD2(*n*+2) can output a second scan signal to the second scan signal line connected to the second scan drivers SCD2(*n*), SCD2 (*n*+1), SCD2(*n*+2) in response to the gate control signal from the timing controller T-con. For example, the second scan signal output from the n-th second scan driver SCD2(*n*) can be supplied to the plurality of sub pixels RSP, GSP, BSP disposed in the n-th pixel line PL(n). Further, the second scan signal output from the n+1-th second scan driver SCD2(*n*+1) can be supplied to the plurality of sub pixels RSP, GSP, BSP disposed in the n+1-th pixel line PL(*n*+1). Further, the second scan signal output from the n+2-th second scan driver SCD2(*n*+2) can be supplied to the plurality of sub pixels RSP, GSP, BSP disposed in the n+2-th pixel line PL(*n*+2).

The emission drivers EMD(n), EMD(*n*+1), EMD(*n*+2) can output an emission signal to the emission signal line connected to the emission drivers EMD(n), EMD(*n*+1), EMD(*n*+2) in response to the gate control signal from the timing controller T-con. For example, the emission signal output from the n-th emission driver EMD(n) can be supplied to the plurality of sub pixels RSP, GSP, BSP disposed in the n-th pixel line PL(n). Further, the emission signal output from the n+1-th emission driver EMD(*n*+1) can be supplied to the plurality of sub pixels RSP, GSP, BSP disposed in the n+1-th pixel line PL(*n*+1). Further, the emission signal output from the n+2-th emission driver EMD(*n*+2) can be supplied to the plurality of sub pixels RSP, GSP, BSP disposed in the n+2-th pixel line PL(*n*+2).

The third scan drivers SCD3(*n*), SCD3(*n*+1), SCD3(*n*+2) can output a third scan signal to the third scan signal line connected to the third scan drivers SCD3(*n*), SCD3(*n*+1), SCD3(*n*+2) in response to the gate control signal from the timing controller T-con. For example, the third scan signal output from the n-th third scan driver SCD3(*n*) can be supplied to the plurality of red sub pixels RSP disposed in the n-th pixel line PL(n), the n+1-th pixel line PL(*n*+1), and the n+2-th pixel line PL(*n*+2). Further, the third scan signal output from the n+1-th third scan driver SCD3(*n*+1) can be supplied to the plurality of green sub pixels GSP disposed in the n-th pixel line PL(n), the n+1-th pixel line PL(*n*+1), and the n+2-th pixel line PL(*n*+2). Further, the third scan signal output from the n+3-th third scan driver SCD3(*n*+3) can be supplied to the plurality of blue sub pixels BSP disposed in the n-th pixel line PL(n), the n+1-th pixel line PL(*n*+1), and the n+2-th pixel line PL(*n*+2).

The fourth scan driver SCD4(*n*) can output a fourth scan signal to the fourth scan signal line connected to the fourth scan driver SCD4(*n*) in response to the gate control signal from the timing controller T-con. For example, the fourth scan signal output from the n-th fourth scan driver SCD4(*n*) can be supplied to the plurality of sub pixels RSP, GSP, BSP disposed in the n-th pixel line PL(n), the n+1-th pixel line PL(*n*+1), and the n+2-th pixel line PL(*n*+2).

Figure 6:
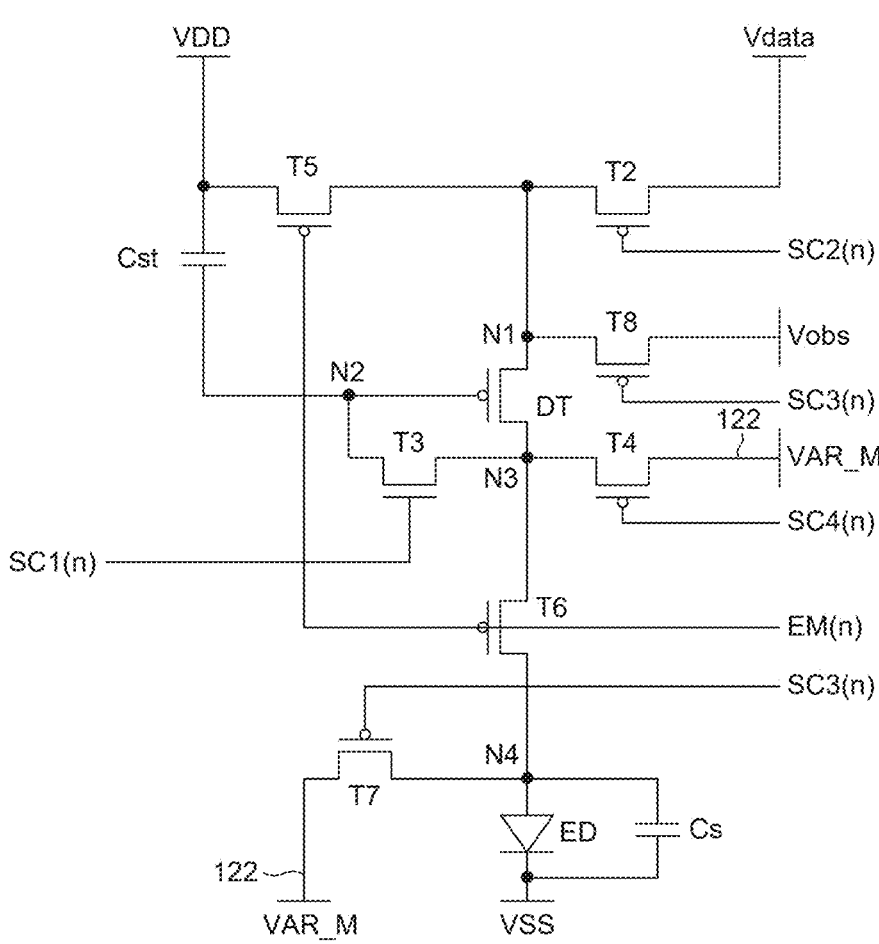
FIG. 6 is an example circuit diagram of a first sub pixel of a display apparatus according to another example embodiment of the present disclosure.

FIG. 6 is an example circuit diagram of a first sub pixel of a display apparatus according to another example embodiment of the present disclosure. In FIG. 6, a circuit of the first sub pixel RSP has the same configuration as the circuit of the first sub pixel RSP of FIG. 3 except a fourth transistor T4 and a seventh transistor T7 so that a detailed description will be omitted or briefly provided.

Referring to FIG. 6, the fourth transistor T4 can apply a reset voltage VAR_M to the third node N3 which is the drain electrode of the driving transistor DT. The fourth transistor T4 can be connected between the second common reset voltage line 122 and the third node N3. For example, the fourth transistor T4 can include a source electrode connected to the second common reset voltage line 122, a drain electrode connected to the third node N3, and a gate electrode connected to a fourth scan signal line which transmits a fourth scan signal SC4(*n*). For example, the fourth transistor T4 can be a p-type MOSFET (PMOS) or can be implemented by a low temperature polycrystalline silicon (LTPS) thin film transistor. Accordingly, the fourth transistor T4 can apply a reset voltage VAR_M supplied to the second common reset voltage line 122 to the third node N3 which is the drain electrode of the driving transistor DT, in response to a low level of fourth scan signal SC4(*n*) which is a turn-on voltage. The reset voltage VAR_M can be a voltage which is supplied to the second common reset voltage line 122. For example, the reset voltage VAR_M can be any one of the first, second, and third reset voltages VAR_R, VAR_G, and VAR_B supplied to the second common reset voltage line 122 according to the operation of the reset voltage supply unit 110. For example, during a period when the first reset voltage VAR_R is supplied to the second common reset voltage line 122, if the low level of fourth scan signal SC4(*n*) is applied, the first reset voltage VAR_R can be applied to the third node N3. However, the present disclosure is not limited thereto. During a period when the second reset voltage VAR_G or the third reset voltage VAR_B is supplied to the second common reset voltage line 122, if the low level of fourth scan signal SC4(*n*) is applied, one of the second reset voltage VAR_G or the third reset voltage VAR_B can be applied to the third node N3.

The seventh transistor T7 can apply a reset voltage VAR_M to the fourth node N4 connected to the anode of the light emitting diode ED. The seventh transistor T7 can be connected between the second common reset voltage line which supplies a reset voltage VAR_M and the fourth node N4. For example, the seventh transistor T7 can include a source electrode connected to the second common reset voltage line 122 which supplies the reset voltage VAR_M, a drain electrode connected to the fourth node N4, and a gate electrode connected to a third scan signal line which transmits a third scan signal SC3($n$). For example, the seventh transistor T7 can be a p-type MOSFET (PMOS) or can be implemented by a low temperature polycrystalline silicon (LTPS) thin film transistor. Accordingly, the seventh transistor T7 can apply the reset voltage VAR_M to the fourth node N4 connected to the anode of the light emitting diode ED, in response to a low level of third scan signal SC3($n$) which is a turn-on voltage. The reset voltage VAR_M can be a voltage which is supplied to the second common reset voltage line 122. For example, the reset voltage VAR_M can be the first reset voltage VAR_R supplied to the second common reset voltage line 122 according to the operation of the reset voltage supply unit 110. For example, during a period when the first reset voltage VAR_R is supplied to the second common reset voltage line 122, if the low level of third scan signal SC3($n$) is applied, the first reset voltage VAR_R can be applied to the fourth node N4.

For example, the fourth transistor T4 and the seventh transistor T7 of the first sub pixel RSP are commonly connected to the second common reset voltage line 122 to be supplied with the same reset voltage VAR_M. For example, during a period when the first reset voltage VAR_R is supplied to the second common reset voltage line 122 according to an operation of the reset voltage supply unit 110, if low levels of fourth scan signal SC4($n$) and third scan signal SC3($n$) are applied, the first reset voltage VAR_R can be supplied to both the fourth transistor T4 and the seventh transistor T7 of the first sub pixel RSP.

Figure 7:
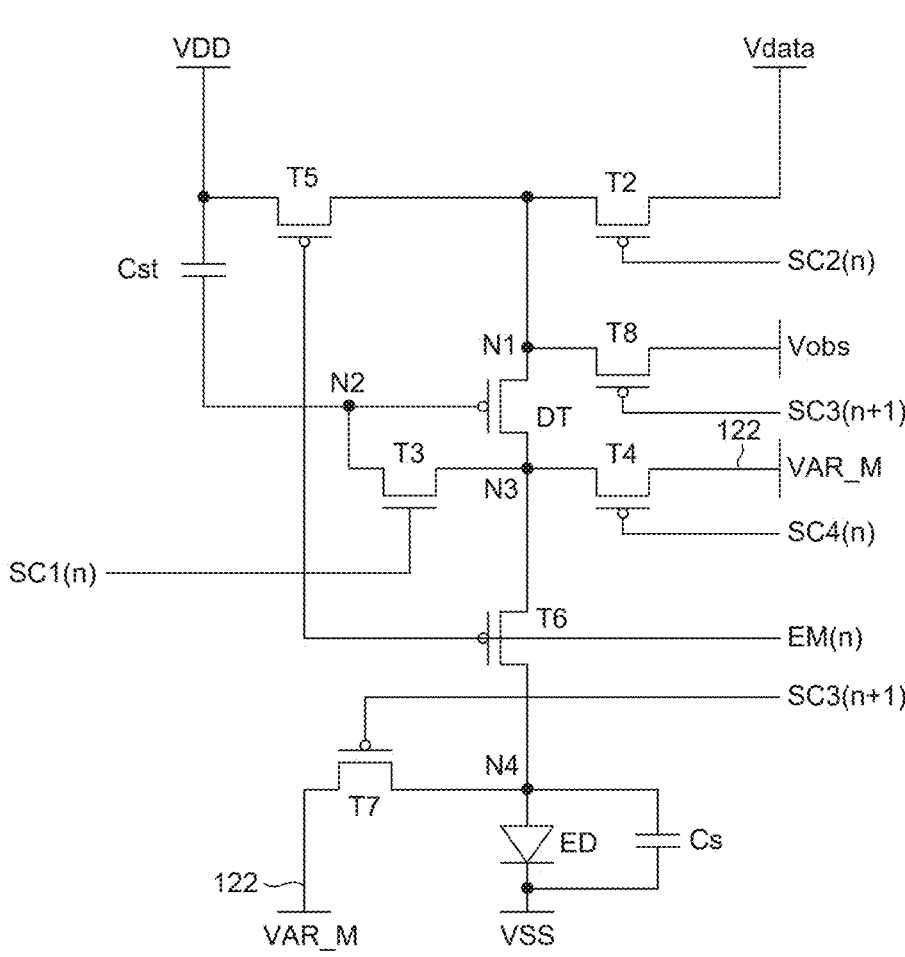
FIG. 7 is an example circuit diagram of a second sub pixel of a display apparatus according to another example embodiment of the present disclosure.

FIG. 7 is an example circuit diagram of a second sub pixel of a display apparatus according to another example embodiment of the present disclosure. In FIG. 7, a circuit of the second sub pixel GSP has the same configuration as the circuit of the first sub pixel RSP of FIG. 6 except a fourth transistor T4, a seventh transistor T7, and an eighth transistor T8 so that a detailed description will be omitted or briefly provided.

Referring to FIG. 7, a reset voltage VAR_M can be supplied to a second common reset voltage line 122 connected to a source electrode of the fourth transistor T4 of the second sub pixel GSP. The reset voltage VAR_M can be a voltage which is supplied to the second common reset voltage line 122. For example, the reset voltage VAR_M can be any one of the first, second, and third reset voltages VAR_R, VAR_G, and VAR_B supplied to the second common reset voltage line 122 according to the operation of the reset voltage supply unit 110. For example, during a period when the second reset voltage VAR_G is supplied to the second common reset voltage line 122, if the low level of fourth scan signal SC4($n$) is applied, the second reset voltage VAR_G supplied to the second common reset voltage line 122 can be applied to the third node N3. However, the present disclosure is not limited thereto. During a period when the first reset voltage VAR_R or the third reset voltage VAR_B is supplied to the second common reset voltage line 122, if the low level of fourth scan signal SC4($n$) is applied, one of the first reset voltage VAR_R or the third reset voltage VAR_B can be applied to the third node N3.

The seventh transistor T7 can apply a reset voltage VAR_M to the fourth node N4 connected to the anode of the light emitting diode ED. The seventh transistor T7 can be connected between the second common reset voltage line which supplies a reset voltage VAR_M and the fourth node N4. For example, the seventh transistor T7 can include a source electrode connected to the second common reset voltage line 122 which supplies the reset voltage VAR_M, a drain electrode connected to the fourth node N4, and a gate electrode connected to a n+1-th third scan signal line which transmits a third scan signal SC3($n$+1). For example, the seventh transistor T7 can be a p-type MOSFET (PMOS) or can be implemented by a low temperature polycrystalline silicon (LTPS) thin film transistor. Accordingly, the seventh transistor T7 can apply the reset voltage VAR_M to the fourth node N4 connected to the anode of the light emitting diode ED, in response to a low level of third scan signal SC3($n$+1) which is a turn-on voltage. The reset voltage VAR_M can be a voltage which is supplied to the second common reset voltage line 122. For example, the reset voltage VAR_M can be the second reset voltage VAR_G supplied to the second common reset voltage line 122 according to the operation of the reset voltage supply unit 110. For example, during a period when the second reset voltage VAR_G is supplied to the second common reset voltage line 122, if the low level of third scan signal SC3($n$+1) is applied, the second reset voltage VAR_G can be applied to the fourth node N4.

For example, the fourth transistor T4 and the seventh transistor T7 of the second sub pixel GSP are commonly connected to the second common reset voltage line 122 to be supplied with the same reset voltage VAR_M. For example, during a period when the second reset voltage VAR_G is supplied to the second common reset voltage line 122 according to an operation of the reset voltage supply unit 110, if low levels of fourth scan signal SC4($n$) and third scan signal SC3($n$+1) are applied, the second reset voltage VAR_G can be supplied to both the fourth transistor T4 and the seventh transistor T7 of the second sub pixel GSP.

The eighth transistor T8 can apply an on-bias stress voltage Vobs to the first node N1 which is the source electrode of the driving transistor DT. The eighth transistor T8 can be connected between an on-bias stress voltage line which supplies an on-bias stress voltage Vobs and the first node N1. For example, the eighth transistor T8 can include a source electrode connected to an on-bias stress voltage line which supplies an on-bias stress voltage Vobs, a drain electrode connected to the first node N1, and a gate electrode connected to a n+1-th third scan signal line which transmits a third scan signal SC3($n$+1). For example, the eighth transistor T8 can be a p-type MOSFET (PMOS) or can be implemented by a low temperature polycrystalline silicon (LTPS) thin film transistor. Accordingly, the eighth transistor T8 can apply the on-bias stress voltage Vobs to the first node N1 which is the source electrode of the driving transistor DT, in response to a low level of third scan signal SC3($n$+1) which is a turn-on voltage.

Figure 8:
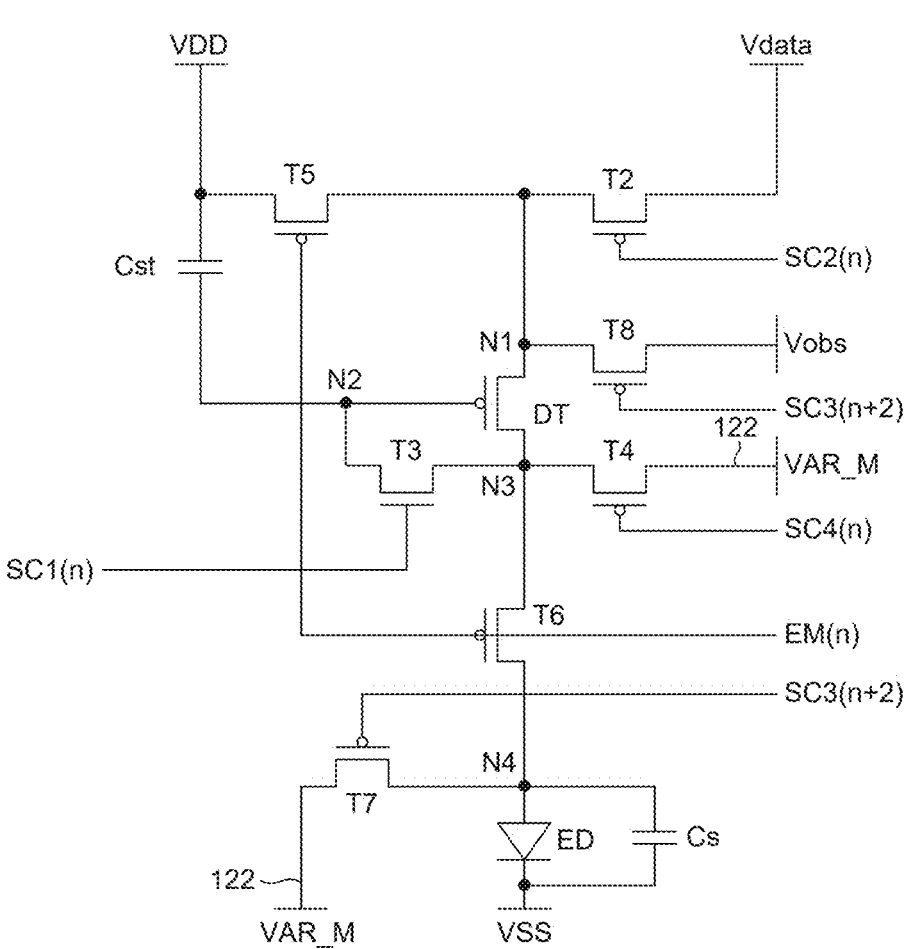
FIG. 8 is an example circuit diagram of a third sub pixel of a display apparatus according to another example embodiment of the present disclosure.

FIG. 8 is an example circuit diagram of a third sub pixel of a display apparatus according to another example embodiment of the present disclosure. In FIG. 8, a circuit of the third sub pixel BSP has the same configuration as the circuit of the first sub pixel RSP of FIG. 4 except a fourth transistor T4, a seventh transistor T7, and an eighth transistor T8 so that a detailed description will be omitted or briefly provided.

Referring to FIG. 8, a reset voltage VAR_M can be supplied to a second common reset voltage line 122 connected to a source electrode of the fourth transistor T4 of the third sub pixel BSP. The reset voltage VAR_M is a voltage which is supplied to the second common reset voltage line 122. For example, the reset voltage VAR_M can be any one of the first, second, and third reset voltages VAR_R, VAR_G, and VAR_B supplied to the second common reset voltage line 122 according to the operation of the reset voltage supply unit 110. For example, during a period when the third reset voltage VAR_B is supplied to the second common reset voltage line 122, if the low level of fourth scan signal SC4($n$) which is a turn-on voltage is applied, the third reset voltage VAR_B supplied to the second common reset voltage line 122 can be applied to the third node N3, but the present disclosure is not limited thereto. During a period when the first reset voltage VAR_R or the second reset voltage VAR_G is supplied to the second common reset voltage line 122, if the low level of fourth scan signal SC4($n$) is applied, one of the first reset voltage VAR_R or the second reset voltage VAR_G can be applied to the third node N3.

The seventh transistor T7 can apply a reset voltage VAR_M to the fourth node N4 connected to the anode of the light emitting diode ED. The seventh transistor T7 can be connected between the second common reset voltage line 122 which supplies a reset voltage VAR_M and the fourth node N4. For example, the seventh transistor T7 can include a source electrode connected to the second common reset voltage line 122 which supplies the reset voltage VAR_M, a drain electrode connected to the fourth node N4, and a gate electrode connected to a n+2-th third scan signal line which transmits a third scan signal SC3($n$+2). For example, the seventh transistor T7 can be a p-type MOSFET (PMOS) or can be implemented by a low temperature polycrystalline silicon (LTPS) thin film transistor. Accordingly, the seventh transistor T7 can apply the reset voltage VAR_M to the fourth node N4 connected to the anode of the light emitting diode ED, in response to a low level of third scan signal SC3($n$+2) which is a turn-on voltage. The reset voltage VAR_M can be a voltage which is supplied to the second common reset voltage line 122. For example, the reset voltage VAR_M can be the third reset voltage VAR_B supplied to the second common reset voltage line 122 according to the operation of the reset voltage supply unit 110. For example, during a period when the third reset voltage VAR_B is supplied to the second common reset voltage line 122, if the low level of third scan signal SC3($n$+2) is applied, the third reset voltage VAR_B can be applied to the fourth node N4.

For example, the fourth transistor T4 and the seventh transistor T7 of the third sub pixel BSP are commonly connected to the second common reset voltage line 122 to be supplied with the same reset voltage VAR_M. For example, during a period when the third reset voltage VAR_B is supplied to the second common reset voltage line 122 according to an operation of the reset voltage supply unit 110, if low levels of fourth scan signal SC4($n$) and third scan signal SC3($n$+2) are applied, the third reset voltage VAR_B can be supplied to both the fourth transistor T4 and the seventh transistor T7 of the third sub pixel BSP The eighth transistor T8 can apply an on-bias stress voltage Vobs to the first node N1 which is the source electrode of the driving transistor DT. The eighth transistor T8 can be connected between an on-bias stress voltage line which supplies an on-bias stress voltage Vobs and the first node N1. For example, the eighth transistor T8 can include a source electrode connected to an on-bias stress voltage line which supplies an on-bias stress voltage Vobs, a drain electrode connected to the first node N1, and a gate electrode connected to a n+2-th third scan signal line which transmits a third scan signal SC3($n$+2). For example, the eighth transistor T8 can be a p-type MOSFET (PMOS) or can be implemented by a low temperature polycrystalline silicon (LTPS) thin film transistor. Accordingly, the eighth transistor T8 can apply the on-bias stress voltage Vobs to the first node N1 which is the source electrode of the driving transistor DT, in response to a low level of third scan signal SC3($n$+2) which is a turn-on voltage.

Figure 9:
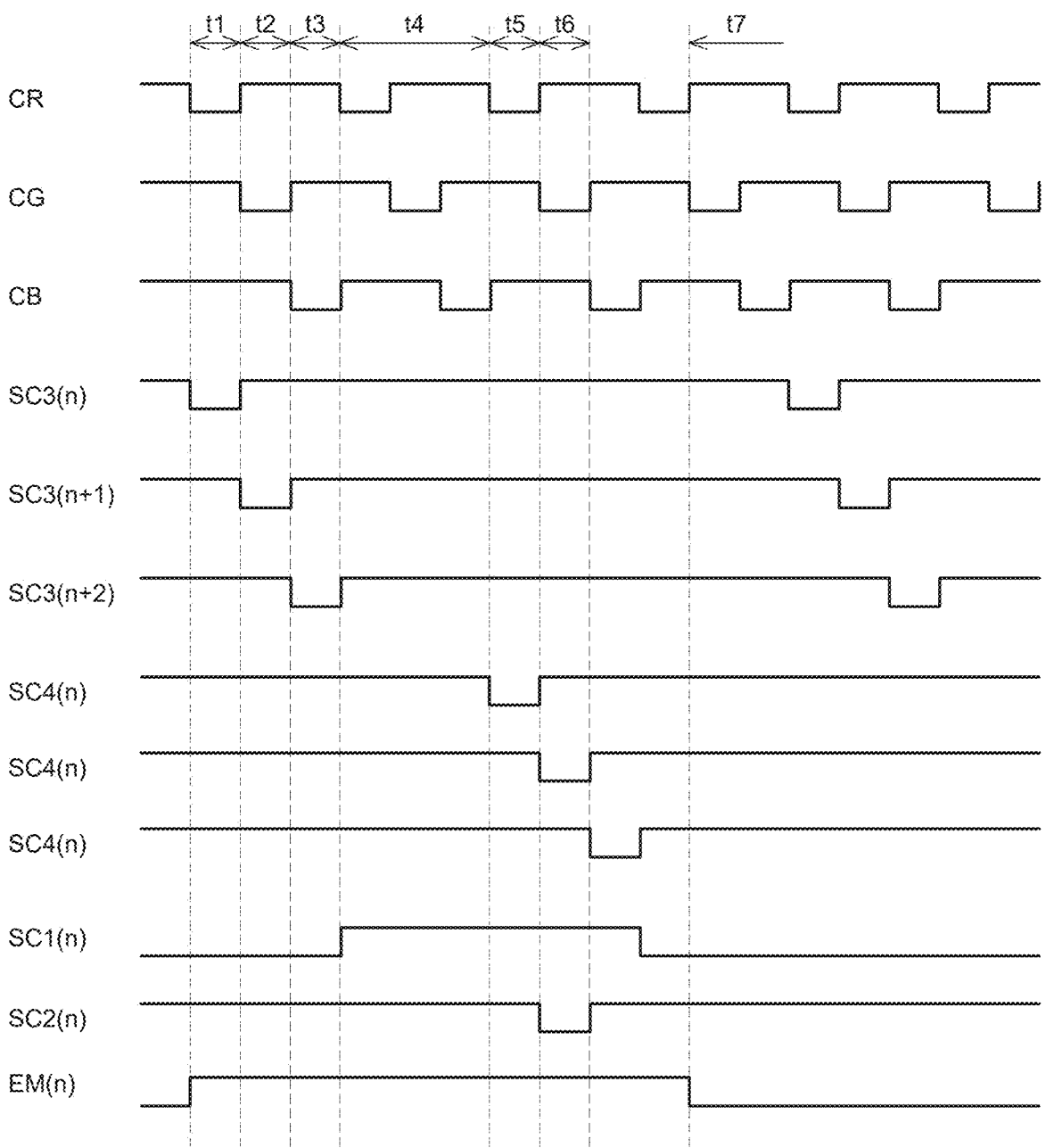
FIG. 9 is a waveform diagram of a control signal and a scan signal when a display apparatus according to another example embodiment of the present disclosure is driven.

FIG. 9 is a waveform diagram of a control signal and a scan signal when a display apparatus according to another example embodiment of the present disclosure is driven. In FIG. 9, for the convenience of description, a first control signal CR, a second control signal CG, a third control signal CB, a first scan signal SC1($n$), a second scan signal SC2($n$), third scan signals SC3($n$), SC3($n$+1), SC3($n$+2), a fourth scan signal SC4($n$), and an emission signal EM(n) are illustrated.

Referring to FIGS. 4 to 9, a low level of first control signal CR is supplied in a first control signal line CL1 during a first period t1. Therefore, the plurality of first reset transistors RT1 are turned on to apply the first reset voltage VAR_R to the first common reset voltage line 121 and the second common reset voltage line 122. Further, a low level of third scan signal SC3($n$) is output to a third scan line in an n-th row during the first period t1. Therefore, the seventh transistor T7 of the red sub pixel RSP is turned on to apply the first reset voltage VAR_R to the fourth node N4 and the eighth transistor T8 is turned on to apply an on-bias stress voltage Vobs to the first node N1. Accordingly, an anode of the light emitting diode ED disposed in the red sub pixel RSP is initialized to a first reset voltage VAR_R by applying a first reset voltage VAR_R to the fourth node N4 during the first period t1. Further, the on-bias stress voltage Vobs is applied to the first node N1 to perform the bias stress on the source electrode of the driving transistor DT. Accordingly, the on-bias stress is performed on the driving transistor DT to initialize a characteristic of the driving transistor DT to a predetermined state.

A low level of second control signal CG is supplied to the second control signal line CL2 during a second period t2. Therefore, the plurality of second reset transistors RT2 are turned on to apply the second reset voltage VAR_G to the first common reset voltage line 121 and the second common reset voltage line 122. Further, a low level of third scan signal SC3($n$+1) is output to a third scan line in a n+1-th row during the second period t2. Therefore, the seventh transistor T7 of the green sub pixel GSP is turned on to apply the second reset voltage VAR_G to the fourth node N4 and the eighth transistor T8 is turned on to apply an on-bias stress voltage Vobs to the first node N1. Accordingly, an anode of the light emitting diode ED in the green sub pixel GSP is initialized to a second reset voltage VAR_G by applying the second reset voltage VAR_G to the fourth node N4 during the second period t2. Further, the on-bias stress voltage Vobs is applied to the first node N1 to perform the bias stress on the source electrode of the driving transistor DT. Accordingly, the on-bias stress is performed on the driving transistor DT initialize a characteristic of the driving transistor DT to a predetermined state.

A low level of third control signal CB is supplied to the third control signal line CL3 during a third period t3. Therefore, the plurality of third reset transistors RT3 are turned on to apply the third reset voltage VAR_B to the first common reset voltage line 121 and the second common reset voltage line 122. Further, a low level of third scan signal SC3($n$+2) is output to a third scan line in a n+2-th row during the third period t3. Therefore, the seventh transistor T7 of the blue sub pixel BSP is turned on to apply the third reset voltage VAR_B to the fourth node N4. Further, the eighth transistor T8 is turned on to apply an on-bias stress voltage Vobs to the first node N1. Accordingly, an anode of the light emitting diode ED in the blue sub pixel BSP is initialized to a third reset voltage VAR_B by applying a third reset voltage VAR_B to the fourth node N4 during the third period t3. Further, the on-bias stress voltage Vobs is applied to the first node N1 to perform the bias stress on the source electrode of the driving transistor DT. Accordingly, the on-bias stress is performed on the driving transistor DT to initialize a characteristic of the driving transistor DT to a predetermined state.

A high level of first scan signal SC1($n$) is supplied to a first scan line in an n-th row during a fourth period t4. Therefore, the third transistor T3 is turned on to connect the second node N2 and the third node N3. Accordingly, the third transistor T3 is turned on during the fourth period t4 so that the driving transistor DT can be in a diode connection state to serve as a diode.

A low level of fourth scan signal SC4($n$) is supplied to a fourth scan line in an n-th row during a fifth period t5. Therefore, the fourth transistor T4 is turned on to apply any one of reset voltages VAR_R, VAR_G, VAR_B supplied to the first common reset voltage line 121 and the second common reset voltage line 122 to the third node N3. For example, the first reset voltage VAR_R which is supplied to the first common reset voltage line 121 and the second common reset voltage line 122 can be applied to the third node N3. Accordingly, during the fifth period t5, the fourth transistor T4 is turned on so that the drain electrode of the driving transistor DT can be initialized to the first reset voltage VAR_R.

A low level of second scan signal SC2($n$) is supplied to a second scan line in an n-th row during a sixth period t6. Therefore, the second transistor T2 is turned on to apply a data voltage Vdata supplied to the data line DL to the first node N1.

During the sixth period t6, a current Ids flows between the source and the drain of the driving transistor DT. The gate electrode and the drain electrode of the driving transistor DT are diode-connected, so that the voltage of the second node N2 rises by the current flowing from the source electrode to the drain electrode until the gate-source voltage Vgs of the driving transistor DT is equal to a threshold voltage Vth. Accordingly, during the sixth period t6, the voltage of the second node N2 can be charged with a voltage (Vdata−|Vth|) corresponding to the difference between the data voltage Vdata and the threshold voltage Vth of the driving transistor DT.

During a seventh period t7, a low level of emission signal EM(n) is supplied to an emission signal line in an n-th row. Therefore, the fifth transistor T5 and the sixth transistor T6 are turned on to transmit a driving current from the driving transistor DT to the light emitting diode ED.

Figure 10:
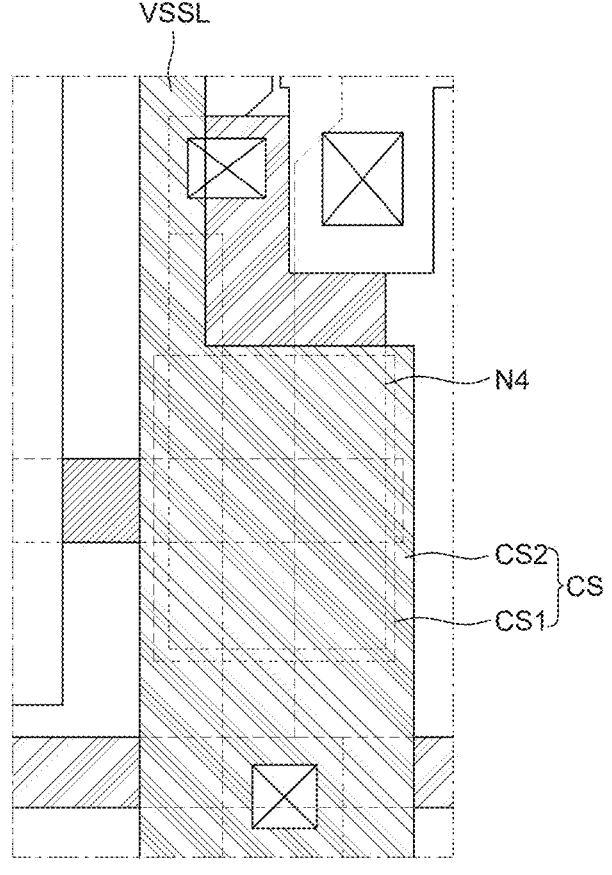
FIG. 10 is a plan view illustrating a partial area around a fourth node of a display apparatus according to still another example embodiment of the present disclosure.
Figure 11:
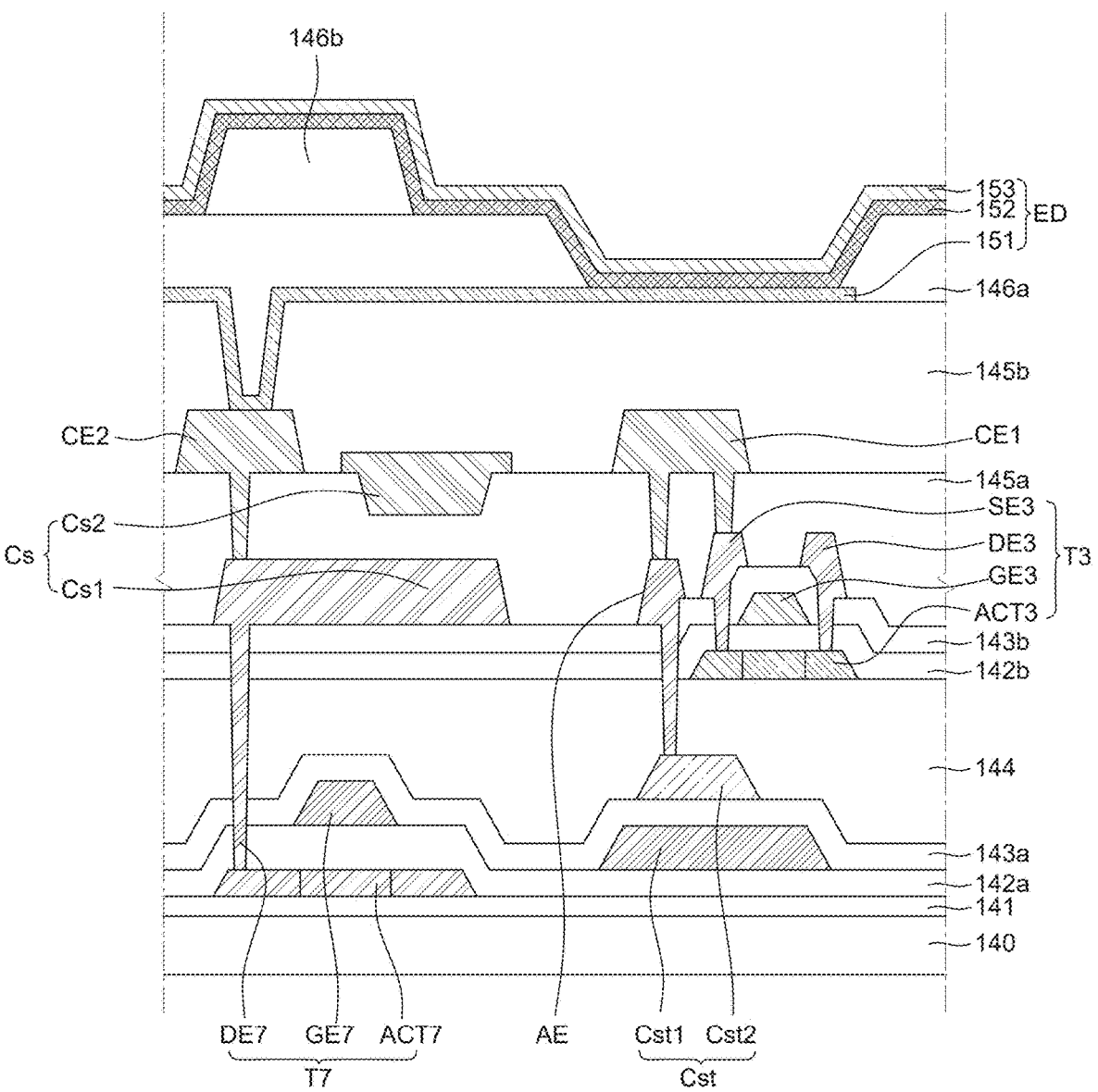
FIG. 11 is a cross-sectional view illustrating a partial area around a fourth node of a display apparatus according to still another example embodiment of the present disclosure.

FIG. 10 is a plan view illustrating a partial area around a fourth node of a display apparatus according to another example embodiment of the present disclosure. FIG. 11 illustrates only a partial area around a fourth node of a display apparatus according to still another example embodiment of the present disclosure.

Referring to FIG. 10, an auxiliary capacitor Cs can be connected to the fourth node N4. The auxiliary capacitor Cs can include a first auxiliary capacitor electrode Cs1 and a second auxiliary capacitor electrode Cs2.

The first auxiliary capacitor electrode Cs1 can be connected to a drain electrode of the seventh transistor T7.

The second auxiliary capacitor electrode Cs2 can be connected to a low potential power voltage line VSSL which supplies a low potential power voltage VSS. For example, the second auxiliary capacitor electrode Cs2 can be integrally formed with the low potential power voltage line VSSL which supplies a low potential power voltage VSS.

FIG. 11 is a cross-sectional view illustrating a partial area around a fourth node of a display apparatus according to one example embodiment of the present disclosure.

Referring to FIG. 11, a display apparatus 100 can include a substrate 140, a first buffer layer 141, a third transistor T3, a seventh transistor T7, a first gate insulating layer 142$a$, a first interlayer insulating layer 143$a$, a second buffer layer 144, a second gate insulating layer 142$b$, a second interlayer insulating layer 143$b$, a connection electrode CE, an auxiliary capacitor Cs, a first planarization layer 145$a$, a second planarization layer 145$b$, a bank 146$a$, a spacer 146$b$, an anode 151, an emission layer 152, and a cathode 153.

The substrate 140 serves to support and protect components of a flexible display apparatus disposed thereabove.

The substrate 140 is a component for supporting various components included in the display apparatus 100 and can be formed of an insulating material. The substrate 140 can include a first substrate, a second substrate, and an interlayer insulating film. The interlayer insulating film can be disposed between the first substrate and the second substrate. As described above, the substrate 140 is configured by the first substrate, the second substrate, and the interlayer insulating film to suppress the moisture permeation. For example, the first substrate and the second substrate can be polyimide (PI) substrates and the interlayer insulating film can be formed of a single layer of silicon nitride (SiNx) or silicon oxide (SiOx) or multi-layers thereof.

The first buffer layer 141 can be disposed on the substrate 140. The first buffer layer 141 can include a multi-buffer layer and an active buffer layer. For example, the multi-buffer layer delays spreading of the moisture or oxygen permeating the substrate 140 and can include at least any one of silicon nitride (SiNx) and silicon oxide (SiOx). The active buffer layer protects a seventh active layer ACT7 and can block various types of defects introduced from the substrate 140. For example, the active buffer layer can include at least any one of a-Si, silicon nitride (SiNx), and silicon oxide (SiOx).

The seventh transistor T7 can be disposed on the first buffer layer 141. The seventh transistor T7 can include a seventh active layer ACT7, a seventh gate electrode GE7, a seventh source electrode, and a seventh drain electrode DE7. Here, depending on the design of the pixel circuit, the seventh source electrode can serve as a seventh drain electrode DE7 and the seventh drain electrode DE7 can serve as a seventh source electrode.

The seventh active layer ACT7 can be disposed on the first buffer layer 141. The seventh active layer ACT7 can include amorphous silicon or polycrystalline silicon. For example, the seventh active layer ACT7 can include a low-temperature polycrystalline silicon LTPS. For example, since the polysilicon material has a high mobility (100 cm$^2$/Vs or higher), an energy power consumption is low and a reliability is high, so that the polysilicon material can be applied to a gate driver for a driving element which drives transistors for a display element and/or a multiplexer MUX. For example, the seventh active layer ACT7 can include a seventh channel region in which a channel is formed when the seventh transistor T7 is driven and a seventh source region and a seventh drain region on both sides of the seventh channel region. The seventh source region refers to a part of the seventh active layer ACT7 which is connected to the seventh source electrode and the seventh drain region refers to a part of the seventh active layer ACT7 which is connected to the seventh drain electrode DE7. For example, the seventh source region and the seventh drain region can be configured by ion-doping (impurity doping) of the seventh active layer ACT7. The seventh source region and the seventh drain region can be generated by doping ions into the polycrystalline silicon material and the seventh channel region can refer to a part in which the ions are not doped, but the polycrystalline silicon material remains.

The first gate insulating layer 142a can be disposed on the seventh active layer ACT7. The first gate insulating layer 142a can be configured by a single layer of silicon nitride (SiNx) or silicon oxide (SiOx) or a multi-layer thereof. A contact hole through which the seventh source electrode and the seventh drain electrode DE7 of the seventh transistor T7 are connected to a first source region and a first drain region of the seventh active layer ACT7 of the seventh transistor T7 can be formed in the first gate insulating layer 142a.

The seventh gate electrode GE7 of the seventh transistor T7 and a first capacitor electrode Cst1 of the storage capacitor Cst can be disposed on the first gate insulating layer 142a.

At this time, the seventh gate electrode GE7 and the first capacitor electrode Cst1 can be formed by a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof. The seventh gate electrode GE7 can be disposed on the first gate insulating layer 142a so as to overlap the first channel region of the seventh active layer ACT7 of the seventh transistor T7.

The seventh gate electrode GE7 and the first capacitor electrode Cst1 can be formed by the same process. Further, the seventh gate electrode GE7 and the first capacitor electrode Cst1 can be formed of the same material and can be formed on the same layer.

The first interlayer insulating layer 143a can be disposed on the first gate insulating layer 142a, the seventh gate electrode GE7, and the first capacitor electrode Cst1. The first interlayer insulating layer 143a can be configured by a single layer of silicon nitride (SiNx) or silicon oxide (SiOx) or a multi-layer thereof. Further, in the first interlayer insulating layer 143a, a contact hole which exposes the first source region and the first drain region of the seventh active layer ACT7 of the seventh transistor T7 can be formed.

A second capacitor electrode Cst2 of the storage capacitor Cst can be disposed on the first interlayer insulating layer 143a. The second capacitor electrode Cst2 can be formed by a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof. The second capacitor electrode Cst2 can be formed on the first interlayer insulating layer 143a as to overlap the first capacitor electrode Cst1. Further, the second capacitor electrode Cst2 can be formed of the same material as the first capacitor electrode Cst1.

The second buffer layer 144 can be disposed on the first interlayer insulating layer 143a and the second capacitor electrode Cst2. The second buffer layer 144 can be configured by a single layer of silicon nitride (SiNx) or silicon oxide (SiOx) or a multi-layer thereof. A contact hole which exposes the first source region and the first drain region of the seventh active layer ACT7 of the seventh transistor T7 can be formed in the second buffer layer 144. Further, in the second buffer layer 144, a contact hole which exposes the second capacitor electrode Cst2 of the storage capacitor Cst can be formed.

The second buffer layer 144 can be formed by a multi-layer, but is not limited thereto.

The third active layer ACT3 of the third transistor T3 can be disposed on the second buffer layer 144. Here, the third transistor T3 can include a third active layer ACT3, a second gate insulating layer 142b, a third gate electrode GE3, a third source electrode SE3, and a third drain electrode DE3. Here, depending on the design of the pixel circuit, the third source electrode SE3 can serve as a drain electrode and the third drain electrode DE3 can serve as a source electrode.

Further, the third active layer ACT3 can include a second channel region in which a channel is formed when the third transistor T3 is driven and a second source region and a second drain region on both sides of the second channel region. The second source region refers to a part of the third active layer ACT3 which is connected to the third source electrode SE3 and the second drain region can refer to a part of the third active layer ACT3 which is connected to the third drain electrode DE3.

The third active layer ACT3 can be formed of an oxide semiconductor. The oxide semiconductor material has a large band gap as compared with a silicon material so that electrons may not jump over the band gap in an off state. Therefore, the oxide semiconductor material has a low off-current. Therefore, the thin film transistor including an active layer which is formed of an oxide semiconductor is suitable for a switching thin film transistor which maintains on-time to be short and off-time to be long, but is not limited thereto. Further, due to the small off-current, a magnitude of an auxiliary capacitance can be reduced so that the oxide semiconductor can be appropriate for a high resolution display element. For example, the third active layer ACT3 can be formed of metal oxide and for example, can be formed of various metal oxides such as indium-gallium-zinc-oxide (IGZO). Here, the description was made under assumption that the third active layer ACT3 of the third transistor T3 is configured by IGZO, among various metal oxides, but it is not limited thereto. Therefore, the third active layer can be formed of another metal oxide such as indium-zinc-oxide (IZO), indium-gallium-tin-oxide (IGTO), or indium-gallium-oxide (IGO), rather than IGZO.

The third active layer ACT3 can be formed by depositing the metal oxide on the second buffer layer 144, performing a heat treatment for stabilization, and then patterning the metal oxide.

The second gate insulating layer 142b can be disposed on the entire substrate 140 including the third active layer ACT3. For example, the second gate insulating layer 142b can be configured by a single layer of silicon nitride (SiNx) or silicon oxide (SiOx) or a multi-layer thereof.

The third gate electrode GE3 can be disposed on the second gate insulating layer 142b.

The third gate electrode GE3 can be formed by a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof.

For example, a metal material is formed on the second gate insulating layer 142b, a photoresist pattern is formed on the metal material, and then the metal material is wet-etched using the photoresist pattern as a mask to form the third gate electrode GE3. As a wet etchant for etching the metal material, a material which selectively etches molybdenum (Mo), copper (Cu), titanium (Ti), aluminum (Al), chrome (Cr), gold (Au), nickel (Ni), and neodymium (Nd) or an alloy thereof which configures the material but does not etch the insulating material can be used.

The second interlayer insulating layer 143b can be disposed on the second gate insulating layer 142b and the third gate electrode GE3. A contact hole which exposes the seventh active layer ACT7 of the seventh transistor T7 and the third active layer ACT3 of the third transistor T3 can be formed in the second interlayer insulating layer 143b. For example, a contact hole which exposes the first source region and the first drain region of the seventh active layer ACT7 of the seventh transistor T7 can be formed in the second interlayer insulating layer 143b. A contact hole which exposes the second source region and the second drain region of the third active layer ACT3 of the third transistor T3 can be formed in the second interlayer insulating layer 143b.

The second interlayer insulating layer 143b can be configured as a single layer of silicon nitride (SiNx) or silicon oxide (SiOx) or a multi-layer thereof.

An auxiliary electrode AE, a first auxiliary capacitor electrode Cs1, a seventh source electrode and a seventh drain electrode DE7 of the seventh transistor T7 and a third source electrode SE3 and a third drain electrode DE3 of the third transistor T3 can be disposed on the second interlayer insulating layer 143b.

The auxiliary electrode AE can be electrically connected to the second capacitor electrode Cst2 of the storage capacitor Cst through a contact hole formed in the second interlayer insulating layer 143b, the second gate insulating layer 142b, and the second buffer layer 144. The auxiliary electrode AE is electrically connected to the connection electrode CE to be described below to be electrically connected to the source electrode SE3 of the third transistor.

The first auxiliary capacitor electrode Cs1 is one electrode of the auxiliary capacitor Cs and can be connected to a drain electrode of the seventh transistor T7. For example, the first auxiliary capacitor electrode Cs1 can be integrally formed with a drain electrode of the seventh transistor T7.

The auxiliary electrode, the first auxiliary capacitor electrode Cs1, the seventh source electrode and the seventh drain electrode DE7 of the seventh transistor T7 and the third source electrode SE3 and the third drain electrode DE3 of the third transistor T3 can be formed of the same material by the same process.

For example, the auxiliary electrode, the first auxiliary capacitor electrode Cs1, the seventh source electrode and the seventh drain electrode DE7 of the seventh transistor T7 and the third source electrode SE3 and the third drain electrode DE3 of the third transistor T3 can be formed by a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof. For example, the auxiliary electrode CE, the first auxiliary capacitor electrode Cs1, the seventh source electrode and the seventh drain electrode DE7 of the seventh transistor T7 and the third source electrode SE3 and the third drain electrode DE3 of the third transistor T3 can be formed of a triple layered structure of titanium (Ti)/aluminum (Al)/titanium (Ti), but are not limited thereto.

Planarization layers 145a and 145b can be disposed on the second interlayer insulating layer 143b. The planarization layers 145a and 145b can include a first planarization layer 145a and a second planarization layer 145b.

The first planarization layer 145a can be disposed above the auxiliary electrode, the first auxiliary capacitor electrode Cs1, the seventh source electrode and the seventh drain electrode DE7 of the seventh transistor T7 and the third source electrode SE3 and the third drain electrode DE3 of the third transistor T3, and the second interlayer insulating layer 143b.

The first planarization layer 145a can be an organic layer which planarizes and protects upper portions of the seventh transistor T7 and the third transistor T3. For example, the first planarization layer 145a can be formed of an organic material such as acryl resin, epoxy resin, phenolic resin, polyamide resin, or polyimide resin.

The connection electrode CE can be disposed on the first planarization layer 145a. The first connection electrode CE1 is connected to the third source electrode SE3 of the third transistor T3 through a contact hole of the first planarization layer 145a and can be connected to the second capacitor electrode Cst2 of the storage capacitor Cst through a contact hole of the first planarization layer 145a. Therefore, the first connection electrode CE1 can electrically connect the third source electrode SE3 of the third transistor T3 and the second capacitor electrode Cst2 of the storage capacitor Cst. The second connection electrode CE2 can be connected to the seventh drain electrode DE7 of the seventh transistor T7 through the contact hole of the first planarization layer 145a. For example, the connection electrode CE can be formed of a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof.

The second auxiliary capacitor electrode Cs2 is a remaining electrode of the auxiliary capacitor Cs and can be connected to a low potential power voltage line VSSL which supplies a low potential power voltage VSS. For example, the second auxiliary capacitor electrode Cs2 can be integrally formed with the low potential power voltage line VSSL which supplies a low potential power voltage VSS. The second auxiliary capacitor electrode Cs2 can be disposed above the first auxiliary capacitor electrode Cs1 so as to overlap the first auxiliary capacitor electrode Cs1. At this time, the first planarization layer 145a has a groove formed in a location overlapping the first auxiliary capacitor electrode Cs1. For example, the groove can be concavely formed. For example, the first planarization layer 145a is simultaneously formed with the same material using a halftone mask and is formed to have different thicknesses to form a groove. However, the method of forming the groove is not limited thereto. In the groove of the first planarization layer 145a, the second auxiliary capacitor electrode Cs2 can be disposed to be more adjacent to the first auxiliary capacitor electrode Cs1 than the other area of the low potential power voltage VSS. Therefore, the second auxiliary capacitor electrode Cs2 disposed in the groove of the first planarization layer 145a is disposed to be adjacent to the first auxiliary capacitor electrode Cs1 so that a capacitor can be formed between the second auxiliary capacitor electrode Cs2 and the first auxiliary capacitor electrode Cs1.

The second planarization layer 145b can be disposed above the connection electrode CE, the second auxiliary capacitor electrode Cs2, and the first planarization layer 145a. For example, the second planarization layer 145b can be formed of an organic material, such as acryl resin, epoxy resin, phenolic resin, polyamide resin, or polyimide resin.

The light emitting diode ED can be disposed on the second planarization layer 145b.

The anode 151 can be disposed on the second planarization layer 145b. At this time, the anode 151 can be electrically connected to the connection electrode CE through the contact hole provided in the second planarization layer 145b. The anode 151 can be formed with a single layer or a multi-layered structure including aluminum (Al), silver (Ag), copper (Cu), lead (Pb), molybdenum (Mo), and titanium (Ti), or an alloy thereof.

When the display apparatus 100 is a top emission type in which light emitted from the light emitting diode ED is emitted above the substrate SUB in which the light emitting diode ED is disposed, the anode 151 can further include a transparent conductive layer and a reflective layer on the transparent conductive layer. The transparent conductive layer can be formed of transparent conductive oxide such as ITO or IZO and the reflective layer can be formed of silver (Ag), aluminum (Al), gold (Au), molybdenum (Mo), tungsten (W), chrome (Cr), or an alloy thereof.

The bank 146a can be disposed on the anode 151 and second planarization layer 145b. The bank 146a can be disposed while covering at least a part of the anode 151. A part of the bank 146a corresponding to an emission area of the sub pixel can be open. A part of the anode 151 can be exposed through the open part of the bank 146a (hereinafter, referred to as an open area). At this time, the bank 146a can be formed of an inorganic insulating material, such as silicon nitride (SiNx) or silicon oxide (SiOx), or an organic insulating material, such as benzocyclobutene-based resin, acrylic-based resin or imide-based resin, but is not limited thereto. The spacer 146b can be further disposed on the bank 146a. The spacer 146b can serve to support a mask when the mask is aligned on the bank 146a in a process for depositing the anode 151. The spacer 146b can be integrally configured with the bank 146a.

The emission layer 152 can be disposed on the anode 151, the bank 146a, and the spacer 146b. The emission layer 152 can be disposed in the open area of the bank 146a and on the bank 146a and the spacer 146b. Therefore, the emission layer 152 can be disposed on the anode 151 exposed through the open area of the bank 146a. The emission layer 152 can include a material which emits light of a specific color. For example, the emission layer 152 can include an emission material which emits any one of red light, green light, and blue light. Specifically, the emission layer 152 can include at least one of a hole injection layer (HIL), a hole transport layer (HTL), an emission layer (EML), an electron transport layer (ETL), and an electron injection layer (EIL). Some components of the emission layer 152 can be omitted depending on the structure or the characteristic of the display apparatus 100. The cathode 153 can be disposed on the emission layer 152. The cathode 153 can be formed of a conductive material having a low work function. When the display apparatus 100 is a top emission type display apparatus, the cathode 153 can be formed of transparent conductive oxide, such as indium tin oxide or indium zinc oxide or a transparent conductive material such as ytterbium (Yb), but is not limited hereto.

Accordingly, the display apparatus 100 according to the example embodiment of the present disclosure can reset an anode with an optimal voltage for every sub pixel. When the same anode reset voltage is supplied to all sub pixels with different colors, a capacitor capacity is different for every color and there is a problem in that inferiority in electro-optical items occurs due to the differences in lifespan and areas of the emission areas. Accordingly, the display apparatus 100 according to the example embodiment of the present disclosure supplies different reset voltages to a red sub pixel, a green sub pixel, and a blue sub pixel to reset the anode with an optimal voltage for every sub pixel, thereby improving electro-optical characteristics.

When different reset voltage lines are connected to a red sub pixel, a green sub pixel, and a blue sub pixel of the display apparatus to supply different reset voltages, reset voltage lines for supplying individual reset voltages are necessary in the active area. Therefore, there is a problem in that design is difficult and a capacitor with another signal line is increased to degrade a display quality. Therefore, in the display apparatus 100 according to the example embodiment of the present disclosure, a red sub pixel, a green sub pixel, and a blue sub pixel are connected to one common reset voltage line 120 and a reset voltage which is supplied to the common reset voltage line 120 can be controlled by the reset voltage supply unit 110. Accordingly, the display apparatus 100 according to the example embodiment of the present disclosure supplies different reset voltages for every sub pixel to one common reset voltage line 120 so that an optimal reset voltage can be supplied for every sub pixel without adding a separate voltage line in an active area.

When an initialization voltage which initializes a driving transistor and a reset voltage which resets an anode of the light emitting diode are supplied to a red sub pixel, a green sub pixel, and a blue sub pixel of the display apparatus, a line which supplies an initialization voltage and a reset voltage line which supplies a reset voltages are separately necessary in the active area. Therefore, there is a problem in that design is difficult and a capacitor with another signal line is increased to degrade a display quality. Therefore, in the display apparatus 100 according to the example embodiment of the present disclosure, an initialization voltage which is supplied to a red sub pixel, a green sub pixel, and a blue sub pixel and a reset voltage are connected to be supplied to one common reset voltage line 120. A reset voltage which is the most similar to the initialization voltage, among the reset voltages, is supplied to the common reset voltage line 120. At this time, the reset voltage can be lower than a reset voltage required for the corresponding sub pixel. Accordingly, an auxiliary capacitor Cs is disposed between the anode and the low potential voltage line to be connected to the light emitting diode ED in parallel to increase the capacitor. Therefore, a reset voltage to be supplied increases to compensate for a corresponding sub pixel.

A display apparatus according to the example embodiments of the present disclosure can also be described as follows:

A display apparatus according to an example embodiment of the present disclosure includes a display panel including an active area in which a plurality of sub pixels with different colors is disposed and a non-active area which encloses the active area, a light emitting diode which is disposed in each of the plurality of sub pixels and includes an anode and a cathode and a common reset voltage line which is connected to the anode to transmit different reset voltages to the anode in each of the plurality of sub pixels.

The display apparatus can further include a reset voltage supply unit which is disposed in the non-active area and is connected to the common reset voltage line to supply different reset voltages to the plurality of sub pixels with different colors.

The reset voltage supply unit can include a plurality of reset transistors connected between a plurality of reset voltage lines which supplies the reset voltage and the common reset voltage line.

The reset voltage supply unit can further include at least one first reset transistor which is connected between a first reset voltage line to which a first reset voltage is supplied and the common reset voltage line to connect the first reset voltage line and the common reset voltage line according to a first control signal, at least one second reset transistor which is connected between a second reset voltage line to which a second reset voltage is supplied and the common reset voltage line to connect the second reset voltage line and the common reset voltage line according to a second control signal and at least one third reset transistor which is connected between a third reset voltage line to which a third reset voltage is supplied and the common reset voltage line to connect the third reset voltage line and the common reset voltage line according to a third control signal.

The common reset voltage line can include at least one first common reset voltage line which is disposed in the non-active area so as to enclose the active area and is connected to the reset voltage supply unit and a plurality of second common reset voltage lines which are connected to the first common reset voltage line and extend to the active area to be connected to the plurality of sub pixels.

The plurality of sub pixels can include a driving transistor which is disposed between a first node and a third node to control the driving current, a second transistor which is connected between a data line which supplies a data voltage and the first node, a third transistor connected between the third node and a second node, a fourth transistor which is connected between the third node and the common reset voltage line and applies the reset voltage to the third node, a fifth transistor which is connected between a high potential voltage line which supplies a high potential voltage and the first node and applies the high potential voltage to the first node, a sixth transistor which is connected between the third node and an anode of the light emitting diode and forms a current path between the driving transistor and the light emitting diode, a seventh transistor which is connected between the anode and the common reset voltage line and applies the reset voltage to the anode, an eighth transistor which is connected between the first node and an on-bias stress voltage line which supplies an on-bias stress voltage and applies the on-bias stress voltage to the first node and a storage capacitor connected between the second node and the high potential voltage line.

The plurality of sub pixels can further include an auxiliary capacitor connected between the anode and the cathode.

The plurality of sub pixels can include a red sub pixel, a green sub pixel, and a blue sub pixel, and a third scan signal supplied from an n-th gate line is applied to gate electrodes of a seventh transistor and an eighth transistor included in the red sub pixel, a third scan signal supplied from a n+1-th gate line is applied to gate electrodes of a seventh transistor and an eighth transistor included in the blue sub pixel, and a third scan signal supplied from an n+2-th gate line is applied to gate electrodes of a seventh transistor and an eighth transistor included in the green sub pixel.

The display apparatus can further include a gate driver which supplies a first scan signal, a second scan signal, a third scan signal, a fourth scan signal, and an emission signal to a plurality of gate lines connected to the plurality of sub pixels, the gate driver supplies the fourth scan signal to a plurality of sub pixels disposed in an n-th pixel line, a n+1-th pixel line, and a n+2-th pixel line.

The gate driver can comprise a plurality of stages, each of which comprise a plurality of scan drivers and an emission driver corresponding to the pixel line.

The display panel can include a substrate, a plurality of insulating layers disposed on the substrate, a first auxiliary capacitor electrode disposed on the plurality of insulating layers, a planarization layer disposed on the first capacitor electrode and the plurality of insulating layers and a second auxiliary capacitor electrode which is disposed on the planarization layer so as to overlap the first capacitor electrode.

The planarization layer can further include a groove disposed in a position which overlaps the first auxiliary capacitor electrode and the second auxiliary capacitor electrode is disposed in the groove.

Although the example embodiments of the present disclosure have been described in detail with reference to the accompanying drawings, the present disclosure is not limited thereto and can be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display apparatus, comprising:
a display panel including an active area in which a plurality of sub pixels are disposed and a non-active area adjacent to the active area, wherein the plurality of sub pixels are configured to emit light of different colors;
a light emitting diode disposed in each of the plurality of sub pixels and including an anode and a cathode;
a common reset voltage line connected to the anode to transmit different reset voltages to the anode in each of the plurality of sub pixels; and
a reset voltage supply unit disposed in the non-active area and connected to the common reset voltage line to supply different reset voltages to the plurality of sub pixels,
wherein the reset voltage supply unit supplies different reset voltages for each color to the common reset voltage line.

2. The display apparatus according to claim 1, wherein the reset voltage supply unit includes:
a plurality of reset transistors connected between the common reset voltage line and a plurality of reset voltage lines configured to supply the reset voltages.

3. The display apparatus according to claim 2, wherein the reset voltage supply unit further includes:
at least one first reset transistor connected between a first reset voltage line to which a first reset voltage is supplied and the common reset voltage line to connect the first reset voltage line and the common reset voltage line according to a first control signal;
at least one second reset transistor connected between a second reset voltage line to which a second reset voltage is supplied and the common reset voltage line to connect the second reset voltage line and the common reset voltage line according to a second control signal; and
at least one third reset transistor connected between a third reset voltage line to which a third reset voltage is supplied and the common reset voltage line to connect the third reset voltage line and the common reset voltage line according to a third control signal.

4. The display apparatus according to claim 1, wherein the common reset voltage line includes:

at least one first common reset voltage line disposed in the non-active area so as to enclose the active area, and connected to the reset voltage supply unit; and a plurality of second common reset voltage lines connected to the first common reset voltage line and extending to the active area to be connected to the plurality of sub pixels.

5. The display apparatus according to claim 1, wherein each of the plurality of sub pixels include:

a driving transistor disposed between a first node and a third node to control a driving current;

a second transistor connected between a data line for supplying a data voltage and the first node;

a third transistor connected between the third node and a second node;

a fourth transistor connected between the third node and the common reset voltage line and configured to apply the reset voltage to the third node;

a fifth transistor connected between a high potential voltage line for supplying a high potential voltage and the first node, and configured to apply the high potential voltage to the first node;

a sixth transistor connected between the third node and an anode of the light emitting diode, and configured to form a current path between the driving transistor and the light emitting diode;

a seventh transistor connected between the anode and the common reset voltage line and configured to apply the reset voltage to the anode;

an eighth transistor connected between the first node and an on-bias stress voltage line which supplies an on-bias stress voltage, and configured to apply the on-bias stress voltage to the first node; and a storage capacitor connected between the second node and the high potential voltage line.

6. The display apparatus according to claim 5, wherein each of the plurality of sub pixels further include an auxiliary capacitor connected between the anode and the cathode.

7. The display apparatus according to claim 6, wherein a third scan signal supplied from an n-th gate line is applied to gate electrodes of a seventh transistor and an eighth transistor included in a red sub pixel, where n is an integer, wherein a third scan signal supplied from an n+1-th gate line is applied to gate electrodes of a seventh transistor and an eighth transistor included in a blue sub pixel, and wherein a third scan signal supplied from an n+2-th gate line is applied to gate electrodes of a seventh transistor and an eighth transistor included in a green sub pixel.

8. The display apparatus according to claim 6, further comprising:

a gate driver con figured to supply a first scan signal, a second scan signal, a third scan signal, a fourth scan signal, and an emission signal to a plurality of gate lines connected to the plurality of sub pixels, wherein the gate driver supplies the fourth scan signal to a plurality of sub pixels disposed in an n-th pixel line, an n+1-th pixel line, and an n+2-th pixel line, where n is an integer.

9. The display apparatus according to claim 8, wherein the gate driver comprises a plurality of stages, each of which comprises a plurality of scan drivers and an emission driver corresponding to the n-th pixel line, the n+1-th pixel line, and the n+2-th pixel line.

10. The display apparatus according to claim 1, wherein the display panel includes:

a substrate;

a plurality of insulating layers disposed on the substrate;

a first auxiliary capacitor electrode disposed on the plurality of insulating layers;

a planarization layer disposed on the first auxiliary capacitor electrode and the plurality of insulating layers; and a second auxiliary capacitor electrode disposed on the planarization layer so as to overlap the first auxiliary capacitor electrode.

11. The display apparatus according to claim 10, wherein the planarization layer further includes a groove disposed in a position which overlaps the first auxiliary capacitor electrode and the second auxiliary capacitor electrode is disposed in the groove.

* * * * *